(12) United States Patent
Arriagada et al.

(10) Patent No.: US 8,581,398 B2
(45) Date of Patent: *Nov. 12, 2013

(54) TRAP RICH LAYER WITH THROUGH-SILICON-VIAS IN SEMICONDUCTOR DEVICES

(71) Applicant: IO Semiconductor, Inc., San Diego, CA (US)

(72) Inventors: Anton Arriagada, San Diego, CA (US); Chris Brindle, Poway, CA (US); Michael A. Stuber, Carlsbad, CA (US)

(73) Assignee: IO Semiconductor, Inc., San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/762,257

(22) Filed: Feb. 7, 2013

(65) Prior Publication Data

US 2013/0147061 A1 Jun. 13, 2013

Related U.S. Application Data

(63) Continuation of application No. 13/652,240, filed on Oct. 15, 2012, which is a continuation-in-part of application No. 13/313,231, filed on Dec. 7, 2011, now Pat. No. 8,466,036.

(60) Provisional application No. 61/427,167, filed on Dec. 24, 2010.

(51) Int. Cl.
*H01L 23/48* (2006.01)

(52) U.S. Cl.
USPC .......................................... 257/734; 257/739

(58) Field of Classification Search
USPC .................................................. 257/734, 739
See application file for complete search history.

(56) References Cited

U.S. PATENT DOCUMENTS

| | | | |
|---|---|---|---|
| 4,894,705 A | 1/1990 | Kamuro | |
| 5,773,151 A | 6/1998 | Begley et al. | |
| 6,197,695 B1 | 3/2001 | Joly et al. | |
| 6,448,152 B1 | 9/2002 | Henley et al. | |
| 6,472,711 B1 | 10/2002 | Shiota | |
| 6,635,552 B1 | 10/2003 | Gonzalez | |
| 6,737,670 B2 | 5/2004 | Cheng et al. | |
| 6,743,662 B2 | 6/2004 | Fathimulla et al. | |
| 6,835,633 B2 | 12/2004 | Boyd et al. | |

(Continued)

OTHER PUBLICATIONS

Neve et al., Optical Crosstalk Reduction Using a HR-Si Substrate with Trap-Rich Passivization Layer, Proceedings of the 37th European Microwave Conference, Oct. 2007, pp. 592-595.

(Continued)

*Primary Examiner* — Samuel Gebremariam
(74) *Attorney, Agent, or Firm* — The Mueller Law Office, P.C.

(57) ABSTRACT

An integrated circuit chip is formed with a circuit layer, a trap rich layer and through-semiconductor-vias. The trap rich layer is formed above the circuit layer. The through-semiconductor-vias are also formed above the circuit layer. In some embodiments, the circuit layer is included in a wafer, and the trap rich layer and through-semiconductor-vias are included in another wafer. The two wafers are bonded together after formation of the trap rich layer and through-semiconductor-vias. Additionally, in some embodiments, yet another wafer may also be bonded to the wafer that includes the trap rich layer and through-semiconductor-vias. Furthermore, in some embodiments, another circuit layer may be formed in the wafer that includes the trap rich layer and through-semiconductor-vias.

14 Claims, 13 Drawing Sheets

(56) References Cited

U.S. PATENT DOCUMENTS

| | | |
|---|---|---|
| 6,864,155 B2 | 3/2005 | Wang |
| 6,921,914 B2 | 7/2005 | Cheng et al. |
| 7,535,100 B2 | 5/2009 | Kub et al. |
| 7,541,644 B2 | 6/2009 | Hirano et al. |
| 7,585,748 B2 | 9/2009 | Raskin et al. |
| 7,842,568 B2 | 11/2010 | Anderson et al. |
| 7,868,419 B1 | 1/2011 | Kerr et al. |
| 7,915,706 B1 | 3/2011 | Kerr et al. |
| 2004/0009649 A1 | 1/2004 | Kub et al. |
| 2004/0018699 A1 | 1/2004 | Boyd et al. |
| 2007/0032040 A1 | 2/2007 | Lederer |
| 2008/0217727 A1 | 9/2008 | Kjar |
| 2009/0026524 A1 | 1/2009 | Kreupl et al. |
| 2010/0019346 A1 | 1/2010 | Erturk et al. |
| 2012/0146193 A1 | 6/2012 | Stuber et al. |
| 2012/0161310 A1 | 6/2012 | Brindle et al. |

OTHER PUBLICATIONS

Notice of Allowance and Fees dated Apr. 8, 2013 for U.S. Appl. No. 13/652,240.
Office Action dated Mar. 11, 2013 for U.S. Appl. No. 13/313,231.
Abbott and Cotter, Optical and Electrical Properties of Laser Texturing for High-efficiency Solar Cells, Progress in Photovoltaics: Research and Applications Jan. 5, 2006: 14:225-235, published online in Wiley InterScience (www.interscience.wiley.com).
Bolt and Simmons, The Conduction Properties of SIPOS, Solid-State Electronics, May 1987, pp. 533-542, vol. 30, Issue 5, Pergamon Journals LTD, Great Britain.
Drabold and Abtew, Defects in Amorphous Semiconductors: Amorphous Silicon, Theory of Defects in Semiconductors, 2007, pp. 245-268, Springer-Verlag, Berlin Heidelberg.
French, Polysilicon: a versatile material for microsystems, Sensors and Actuators, Apr. 2002, pp. 3-12, vol. 99, Elsevier Science B.V.
Gamble et al., Low-Loss CPW Lines on Surface Stabilized High-Resistivity Silicon, IEE Microwave and Guided Wave Letters, vol. 9, No. 10, Oct. 1999, pp. 395-397.
Hamasaki et al., Crystallographic study of semi-insulating polycrystalline silicon (SIPOS) doped with oxygen atoms, Journal of Applied Physics, Jul. 1978, pp. 3987-3992, vol. 49, Issue 7, American Institute of Physics.
International Search Report and Written Opinion dated Jun. 27, 2012 for PCT Application No. PCT/US2011/063800.
Knecht et al. "3D Via Etch Development for 3D Circuit Integration in FDSOI". Oct. 2005 IEEE International SOI Conference, 104-105.
Lederer et al., "Performance of SOI devices transferred onto passivated HR SOI substrates using a layer transfer technique". Oct. 2006 IEEE International SOI Conference Proceedings. 45-46.
Lederer et at., RF Performance of a Commercial SOI technology Transferred onto a Passivated HR Silicon Substrate, IEEE Transactions on Electron Devices, Jul. 2008, vol. 55, No. 7, pp. 1664-1671.
Lederer, Dimitri, and Jean-Pierrre Raskin. "RF Performance of a Commercial SOI Technology Transferred Onto a Passivated HR Silicon Substrate." IEEE Transactions on Electron Devices 55.7 (Jul. 2008): 1664-671.
MacDonald et al., Texturing industrial multicrystalline silicon solar cells, Solar Energy, Aug. 2003, pp. 277-283, vol. 76, Elsevier Ltd.
Matsumoto et al., The density of states in silicon nanostructures determined by space-charge-limited current measurements, Journal of Applied Physics, Dec. 1 1998, pp. 6157-6161, vol. 84, No. 11, American Institute of Physics.
Nakabayashi et al., Model for the Radiation Degradation of Polycrystalline Silicon Films, IEE Transactions on Nuclear Science, Dec. 2003, pp. 2481-2485, vol. 50, No. 6.
Polyakov, A. et al. "High-resistivity Polycrystalline Silicon as RF Substrate in Wafer-level Packaging." Electronics Letters 41.2 (Jan. 20, 2005).
Raineri et al., Voids in silicon by HE implantation: From basic to applications, Mater Research Society, Jul. 2000, pp. 1449-1476 vol. 15, No. 7.
Raskin, "SOI substrates for More than Moore roadmap", 2012 8th International Caribbean Conference on Devices, Circuits and Systems, IEEE, Mar. 2012, pp. 1-4.
Raskin, J., "SOI Technology: an opportunity for RF designers?", Fifth Workshop of the Thematic Network on Silicon on Insulator Technology, devices and circuits, EUROSOI 2009, Chalmers University of Technology, Sweden, Jan. 19-21, 2009. (Presentation).
Sailor, Fundamentals of Porous Silicon Preparation, Porous Silicon in Practice: Preparation, Characterization and Applicaitons, Published online on Jan. 13, 2012, pp. 1-42, Wiley-VCH Verlag GmBhh & Co., KGaA, Weinheim, Germany.
Shin, Defects in Amorphous Silicon: Dynamics and Role on Crystallization, Thesis, Nov. 1993, California Institute of Technology, Pasadena, California.
Yang and Schwuttke, Minority Carrier Lifetime Improvement in Silicon through Laser Damage Gettering, Phys. Stat. Sol, Oct. 18, 1979, pp. 127-134, vol. 58.
Yoo et al, RIE texturing optimization for thin c-Si solar cells in SF6/O2 plasma, Journal of Physics D: Applied Physics, Apr. 2008, pp. 1-7, vol. 41, IOP Publishing Ltd, UK.
U.S. Appl. No. 13/684,623, filed Oct. 26, 2012.
Office Action dated Mar. 6, 2013 for U.S. Appl. No. 13/652,240.
Notice of Allowance and Fees dated Apr. 18, 2013 for U.S. Appl. No. 13/313,231.
Notice of Allowance and Fees dated May 10, 2013 for U.S. Appl. No. 13/684,623.

TRAP RICH LAYER WITH THROUGH-SILICON-VIAS IN SEMICONDUCTOR DEVICES

CROSS-REFERENCE TO RELATED APPLICATIONS

This application is a continuation of U.S. patent application Ser. No. 13/652,240 filed Oct. 15, 2012, which is a continuation-in-part of U.S. patent application Ser. No. 13/313,231 filed Dec. 7, 2011, which claims priority to U.S. Provisional Patent Application No. 61/427,167 filed Dec. 24, 2010, under 35 U.S.C. §119(e), which is incorporated herein by reference in its entirety.

BACKGROUND OF THE INVENTION

Semiconductor-on-insulator (SOI) technology, which represents an advance over traditional bulk silicon processes, was first commercialized in the late 1990s. The defining characteristic of SOI technology is that the semiconductor region in which circuitry is formed is isolated from the bulk substrate by an electrically insulating layer. One advantage of isolating circuitry from the bulk substrate is a dramatic decrease in parasitic capacitance which allows access to a more desirable power-speed performance horizon. Therefore, SOI structures are particularly appealing for high frequency applications such as radio frequency (RF) communication circuits. As consumer demand continues to tighten the power constraints faced by RF communication circuits, SOI technology continues to grow in importance.

A typical SOI structure 100 is shown in FIG. 1. The SOI structure 100 includes a substrate layer 101, an insulator layer 102, and an active layer 103. The substrate layer 101 is typically a semiconductor material such as silicon. The insulator layer 102 is a dielectric which is often silicon dioxide formed through the oxidation of the substrate layer 101 in situations where the substrate layer 101 is silicon. The active layer 103 includes an active device layer 104 and a metallization or metal interconnect layer 105, which further include a combination of dopants, dielectrics, polysilicon, metal wiring, passivation, and other layers, materials or components that are present after circuitry has been formed therein. The circuitry may include metal wiring 106 (e.g. in the metal interconnect layer 105); passive devices such as resistors, capacitors, and inductors; and active devices such as a transistor 107 (e.g. in the active device layer 104).

As used herein and in the appended claims, the region in which signal processing circuitry is formed on an SOI structure is referred to as the "active layer" of the SOI structure. For example, in FIG. 1 the active layer is the active layer 103 which includes devices or components such as the transistor 107 and the metal wiring 106. When reference is made particularly to the layer of active semiconductor material that forms the active devices themselves the term "active device layer" (e.g. 104) is used instead. For example, in FIG. 1 the active device layer 104 is the portion of the active layer 103 that contains the transistor 107 and does not include the metal wiring 106 of the metal interconnect layer 105.

Also as used herein and in the appended claims, the "top" of the SOI structure 100 references a top surface 108 while the "bottom" of the SOI structure 100 references a bottom surface 109. This orientation scheme persists regardless of the relative orientation of the SOI structure 100 to other frames of reference, and the removal of layers from, or the addition of layers to the SOI structure 100. Therefore, the active layer 103 is always "above" the insulator layer 102. In addition, a vector originating in the center of the active layer 103 and extending towards the bottom surface 109 will always point in the direction of the "back side" of the SOI structure 100 regardless of the relative orientation of the SOI structure 100 to other frames of references, and the removal of layers from, or the addition of layers to the SOI structure 100.

Consumer demand continues to tighten the constraints on the quality and performance of RF devices. These constraints directly affect the required linearity and precision of the signals that are produced and decoded by RF circuits. Among other requirements, signals in one portion of a circuit must be kept from affecting and degrading signals in another portion of the circuit. This effect is called cross talk. The mitigation of cross talk is of critical importance for RF communication circuits because the impedance of certain parasitic pathways within a circuit tend to reach a minimum at frequencies that are used to carry signals in RF circuits. Since these same parasitic pathways connect nodes within a circuit that carry differing signals, the problem of cross talk is especially problematic for RF applications. In addition, it is critically important for the parasitic capacitances to which the signals within a circuit may be exposed not to be signal dependent. This requirement is critical because it is difficult to calibrate out an error that is signal dependent, and such errors are inherently nonlinear.

One solution to the problem of cross talk in electronic circuits is the use of a high resistivity substrate. With reference to FIG. 1, increasing the resistance of the substrate layer 101 reduces cross talk by maintaining the impedance of the parasitic paths through the substrate higher than the impedance would be without an increased substrate resistance. Materials used for the substrate layer 101 typically include very lightly doped silicon such that the substrate layer 101 takes on some of the characteristics of an insulator. The use of high resistivity substrates has proven capable of extending the benefit of SOI structures for RF communication circuits by roughly two orders of frequency magnitude.

Although high resistivity substrates are capable of reducing substrate loss when they are used in SOI processes, they are highly susceptible to another phenomenon called parasitic surface conduction. The problem of parasitic surface conduction and a potential solution can be explained with reference again to FIG. 1. As mentioned previously, the typical high resistivity substrate device insulator layer 102 is silicon dioxide, and the substrate layer 101 is high resistivity silicon. The problem of parasitic surface conduction comes from the fact that the lightly doped silicon that forms the substrate layer 101 can form an inversion or accumulation region as charge carriers are affected by signal voltages in the active layer 103. The degree to which charge carriers in the region 110 are displaced is directly altered by the signals in the active layer 103. As a result, the capacitance of the junction between the substrate layer 101 and the active layer 103, as seen by the active layer, depends on the electric field emanating from the active layer. This capacitance results in nonlinearity and a concomitant loss of signal purity. In addition, an electric field can invert this interface on the side of the substrate layer 101 and create a channel-like layer within the region 110 where charge can move very easily in a lateral direction despite the fact that the substrate layer 101 is highly resistive. Therefore, this effect can also lead to signal-degrading cross talk in RF communication circuits.

A solution to the problem of the undesirable creation of the channel-like layer 110 has commonly been to form a trap rich layer along the top of the substrate layer 101 within the region 110. The presence of this trap rich layer effectively combats parasitic surface conduction because the trap rich layer significantly degrades the carrier lifetimes of the free charge carriers in the region 110. Since the carriers cannot travel far before being trapped, therefore, the effective resistance of the substrate layer 101 is preserved and the capacitance as seen by the active layer 103 is not as dependent upon the signals in the active layer 103.

A problem with the trap rich layer in region 110, however, is that when the trap rich layer is formed prior to the subsequent processing for the formation of the structures in the active layer 103, those later processing steps can degrade the trap rich layer. Processing of semiconductor devices and in particular the production of active devices in the active layer 103 generally involves high temperature processes conducted at temperatures from 1000° C. to 1100° C. High temperature processing of semiconductor structures acts to anneal defects in a semiconductor crystal lattice. This effect is commonly utilized to enhance the electrical properties of electrical circuits. However, contrary to usual applications, the performance of trap rich layers formed from amorphous or polycrystalline silicon crystal patterns is actually decreased when imperfections are annealed out since the number of traps is decreased.

DETAILED DESCRIPTION OF THE INVENTION

Reference now will be made in detail to example embodiments of the disclosed invention, one or more examples of which are illustrated in the accompanying drawings. Each example is provided by way of explanation of the present technology, not as a limitation of the present technology. In fact, it will be apparent to those skilled in the art that modifications and variations can be made in the present technology without departing from the spirit and scope thereof. For instance, features illustrated or described as part of one embodiment may be used with another embodiment to yield a still further embodiment. Thus, it is intended that the present subject matter covers all such modifications and variations within the scope of the appended claims and their equivalents.

Embodiments of the present invention generally inhibit parasitic surface conduction and enhance the RF performance of devices formed in one or more active layers of IC chips. Some embodiments of the present invention achieve these beneficial results by utilizing a layer transferred structure with a trap rich layer in a handle wafer of the layer transferred structure. In some embodiments of the present invention, the substrate is moved away from the active layer to a greater degree than in traditional SOI structures, thereby reducing the effect of substrate loss. In some embodiments of the present invention, the trap rich layer is introduced after active layer processing (e.g. CMOS processing, etc.) is complete, thereby preserving the efficacy of the trap rich layer and minimizing disruption of the integrity of the overall IC chip. Some embodiments of the present invention improve the electrical performance of devices formed in the active layer, improve the efficacy of the trap rich layer for a given potential efficacy, and minimize the potential for manufacturing defects in the overall IC chip.

Figure 2:
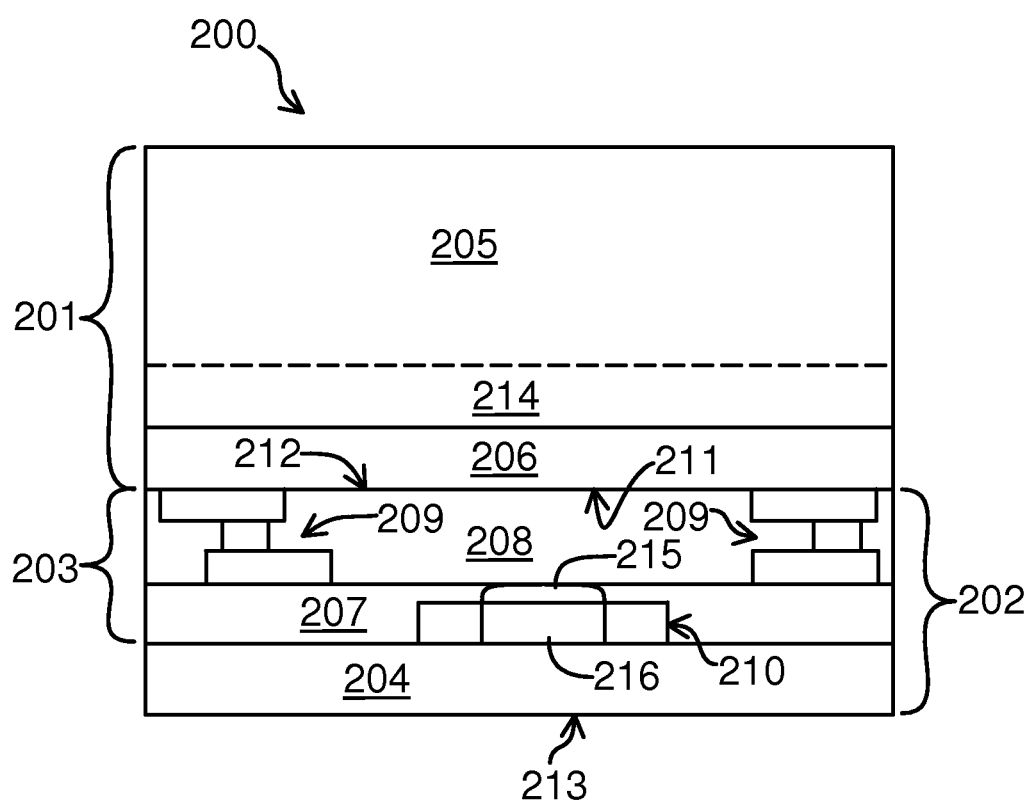
FIG. 2 is a simplified cross section diagram of a portion of a first integrated circuit (IC) chip showing example structures therein that incorporate an embodiment of the present invention.

Some embodiments of the present invention can be described with reference to FIG. 2. FIG. 2 illustrates a structure 200 within a portion of an IC chip. The structure 200 may be formed by wafer bonding or layer transfer techniques, as described below. Therefore, the structure 200 generally comprises a handle wafer 201 bonded to a semiconductor wafer 202. The structure 200 can thus be referred to as a layer transfer structure. The semiconductor wafer 202 generally comprises an active layer 203 having a bottom side in contact with an insulator layer 204. The semiconductor wafer 202 is optionally capped by another insulator layer (not shown). In some embodiments, the semiconductor wafer 202 may be a silicon on sapphire wafer, a gallium arsenide wafer, an SOI wafer, etc. The handle wafer 201 generally comprises a handle substrate layer 205 and a bonding layer 206.

The active layer 203 may be a circuit layer that generally includes an active device layer 207 and a metallization or metal interconnect layer 208, which generally further include a combination of dopants, dielectrics, polysilicon, metal wiring, passivation, and other layers, materials and/or components that are present after circuitry has been formed therein. The circuitry may include metal wiring 209 (e.g. in the metal interconnect layer 208); passive devices such as resistors, capacitors, and inductors; and active devices such as a transistor 210 (e.g. in the active device layer 207). In other embodiments, the active layer 203 may be replaced with a circuit layer having Integrated Passive Devices (IPDs, a.k.a. Integrated Passive Components, IPCs) or a mix of active and passive devices. Such IPD circuit layers generally include functional blocks such as impedance matching circuits, harmonic filters, couplers and baluns and power combiners/dividers, etc. IPD circuit layers are generally fabricated using standard wafer fabrication technologies, such as thin film and photolithography processing, among others. IPD wafers can be designed as flip chip mountable or wire bondable components. Additionally, the substrates for IPD wafers usually are thin film substrates like silicon, alumina or glass. Furthermore, IPD wafers may be formed on quartz with no semiconductor material, so the wafer 202 may be an insulating wafer. Therefore, although the description herein refers to various semiconductor wafers (e.g. 202) and active layers (e.g. 203), other types of wafers and circuit layers (such as insulating wafers and IPD circuit layers, etc.) may be used in place thereof, where appropriate.

The bonding layer 206 can generally be a combination of one or more insulator layers and passivation layers used to isolate and protect the active layer 203. The bonding layer 206 may be a material used to bond a bottom exposed surface 211 of the handle wafer 201 to a top exposed surface 212 of the semiconductor wafer 202 during the wafer bonding or layer transfer procedure. In an alternative embodiment, the bonding layer 206 is added to the semiconductor wafer 202, instead of to the handle wafer 201, before wafer bonding or layer transfer. In some embodiments, the bonding layer 206 is formed by chemical vapor deposition (CVD) or thermal oxidation to create an oxide layer. Depending on the embodiment, as described herein, the bonding layer 206 may be formed before or after the trap rich layer 214. If the bonding layer 206 is formed before the trap rich layer 214, the benefit of the trap rich layer 214 will be slightly eroded due to the heat associated with forming the bonding layer 206. However, a single CVD or thermal oxidation process will not reduce trap density as much as will full active device processing.

The semiconductor wafer 202 may be a conventional semiconductor-on-insulator (SOI) wafer (with the insulator layer 204 formed as a buried oxide or other appropriate insulator or dielectric material) or a conventional bulk semiconductor wafer (with the insulator layer 204 implanted, deposited, grown, etc. as desired). Before bonding the handle wafer 201 to the semiconductor wafer 202, the structures of the active layer 203 are formed in or on a substrate of the semiconductor wafer 202. After bonding, a portion of the original semiconductor substrate (not shown) below the insulator layer 204 is removed such that a back side 213 of the insulator layer 204 is exposed. Once the underlying substrate is removed, the handle wafer 201 provides the required stabilizing force necessary to protect and preserve the electrical characteristics of devices or structures in the active layer 203. Additionally, further metallization or interconnect wiring (not shown) may extend through the insulator layer 204 and be deposited on the back side 213 of the insulator layer 204 for back side electrical connections to the components in the active layer 203.

An advantageous aspect of the configuration described with reference to FIG. 2 is that the resulting substrate (i.e. the handle substrate layer 205) of the structure 200 is further from the active layer 203 than in traditional SOI or bulk semiconductor structures. This feature generally results because the bonding layer 206 is thicker than the insulator layers (similar to the insulator layer 204) of such traditional structures. Since the handle substrate layer 205 is relatively far away from the active layer 203, the effect of parasitic pathways and nonlinear capacitance is significantly lessened.

There are multiple reasons why the bonding layer 206 can be thicker than the insulator layer 204. For example, the insulator layer 204 is a high-quality insulator layer and the time and expense to form thick high-quality insulators is generally prohibitive. Also, the insulator layer 204 may be kept relatively thin because wafer warpage due to different thermal coefficients of expansion between the different layers in a semiconductor wafer or IC chip becomes a more pressing issue as the thickness of such an insulator layer (e.g. 204) increases. For an insulator layer thickness in excess of about 1 micrometer (μm), this effect cannot be mitigated easily using ordinary semiconductor manufacturing techniques. Due to these and other constraints on the maximum thickness thereof, the insulator layer 204 cannot be made arbitrarily thick. Instead, a typical thickness for the insulator layer 204 may be about 0.1 to about 1 μm. On the other hand, a typical thickness for the bonding layer 206, in accordance with some embodiments of the present invention, may be several micrometers thick.

The layer transfer structure 200 described with reference to FIG. 2 generally has fewer problems due to nonlinear substrate capacitance and substrate loss as compared to standard SOI structures. However, conventional layer transfer devices can still suffer from substrate loss due to the presence of the substrate (e.g. the handle substrate layer 205) in the handle wafer (e.g. 201). To increase the resistance of the structure 200 to these phenomena, a trap rich layer 214 may be provided within the handle substrate layer 205 generally adjacent the bonding layer 206 above the active layer 203. As used herein and in the appended claims the term "trap rich layer" generally refers to a layer having a high density of electrically active carrier traps.

As illustrated in FIG. 2, the trap rich layer 214 can be in contact with the bonding layer 206, and the bonding layer 206 can be in contact with the active layer 203. This configuration will effectively eliminate the effect of parasitic substrate conduction and substrate loss by inhibiting the movement of carriers that would otherwise occur at the interface of the handle substrate layer 205 and the bonding layer 206.

In general, a higher trap density within the trap rich layer 214 leads to a greater effect of minimizing nonlinear parasitic capacitance and parasitic surface conduction. In some embodiments of the present invention, the trap rich layer 214 has a trap density of greater than $10^{11}$ $cm^{-2}$ $eV^{-1}$. Since embodiments in which the trap rich layer 214 is formed after the processing necessary to form structures in the active layer 203 do not suffer thermal degradation of the trap rich layer 214, these embodiments generally enable easier or more efficient methods of forming a higher trap density than is typical in the prior art.

In various embodiments of the present invention, the trap rich layer 214 is provided in variant forms. In some example embodiments, the trap rich layer 214 is formed through the deposition of high resistivity material on the surface of the handle substrate layer 205 before the handle wafer 201 is bonded to the semiconductor wafer 202. The deposited material could be polycrystalline semiconductor material or polycrystalline silicon and the handle substrate layer 205 could be very lightly doped silicon such that it has high resistivity.

In alternative embodiments, the trap rich layer 214 is formed through the implantation of high energy particles (e.g. a noble gas, Silicon, Oxygen, Carbon, Germanium, etc.) into the handle substrate layer 205 to create a damaged area in the handle substrate layer 205. The implantation can be done with or without the bonding layer 206 already present. However, the implantation is generally easier without the bonding layer 206, since some materials (e.g. an oxide) for the bonding layer 206 can impede the implantation. On the other hand, if the bonding layer 206 is a thermal oxide material, the heat from the formation of the bonding layer 206 after the implantation for the trap rich layer 214 could degrade the trap rich layer 214. In this case, the implantation is done after the thermal oxidation. For example, an implantation of Argon through about a 1000 Å thermal oxide could be performed at about 1 E15/cm$^2$ and about 240 keV energy. The resulting damage in the silicon substrate will generally extend from the silicon surface to a depth of approximately 2000 Å.

The implanted particles could be Argon or Silicon or other suitable ions and the handle substrate layer 205 could be very lightly doped silicon such that it has high resistivity. Argon could beneficially be employed because it has a relatively large mass, so it will do substantial damage; but it is also inert, so it will not cause any unexpected side effects. Silicon, on the other hand, could be used as the implanted material for similar reasons in that the silicon will disrupt the silicon crystal structure of the handle substrate layer 205, but it will not have any other side effects. Oxygen or carbon could be beneficially used for implant because they can form a relatively stable trap density with respect to subsequent thermal annealing due to the formation of Si—O or Si—C bonds, which disrupt the silicon crystal lattice, leaving some Si bonds dangling. In addition, with sufficient dose and subsequent thermal annealing, O atoms may start to coalesce, forming $SiO_x$ precipitates, which will form stable trap sites in the silicon lattice.

Additionally, multiple implant energies can be used to form the trap rich layer 214 from the bottom surface 211 (or the previous bottom surface before the bonding layer 206 is added) of the handle wafer 201 to a maximum desired depth or distance from the surface 211. Also, the dose can also be varied with the energy to create an almost constant trap density vs. depth. As an example of a two-implant sequence that results in an almost constant damage profile vs. depth, an implantation of Argon at 1E15/cm2 and 240 keV can be followed with a second implantation of Argon at 3E14/cm2 and 60 keV. This sequence will generally result in a damage profile that is almost constant from the silicon surface to a depth of about 3000 A. Furthermore, the implantation can be done with a low beam current and/or backside wafer cooling to prevent self-annealing of damage due to self-heating from the implant beam.

In other alternative embodiments, the trap rich layer 214 is comprised of the entire handle wafer 201. For example, in some embodiments of the present invention, the handle wafer 201 is comprised of high resistivity polysilicon, so the trap rich layer 204 extends through the entire extent of the handle wafer 201. These alternative embodiments would exhibit the advantageous characteristic of excellent performance and low cost because polysilicon wafers are less expensive than monocrystalline silicon wafers and because the traps would be located throughout the thickness of the entire handle wafer 201.

Some embodiments form the trap rich layer 214 throughout the entire handle wafer 201 by irradiating the handle wafer 201 by exposure to relatively high-energy ionizing radiation, such as gamma rays, X-rays or other suitable high-energy particle sources (e.g. MeV electrons, protons or other high-energy particle that can cause semiconductor lattice damage). Such radiation can cause damage to a semiconductor lattice, resulting in trap generation. A suitable gamma ray source, for example, may be Cobalt-60.

An advantage of using radiation is that it penetrates easily through the entire handle wafer 201, thereby forming the traps throughout the entire bulk of the handle wafer 201. This feature makes the trap density per unit volume relatively constant throughout the thickness of the handle wafer 201 and can create a high integrated trap density per unit area of wafer surface, which is desirable. An alternative is to irradiate the surface of the handle wafer 201 with a low-energy radiation that cannot penetrate very deeply into the substrate layer 205, so only a surface layer of traps is formed.

Another benefit of irradiation is that it can be performed on a handle wafer with almost any type of surface films previously deposited thereon. Therefore, the bonding layer 206, for example, can already be present at the surface 211 of the handle wafer 201. Due to the high penetration depth of gamma rays, for example, most of the radiation will pass through the bonding layer 206 and into the substrate layer 205. This feature allows the trap rich layer 214 to be created after the deposition or thermal growth of the bonding layer 206. An additional benefit of trap creation after deposition or growth of the bonding layer 206 is that interface traps may be created at the Si—SiOx interface, causing an additional layer of traps at the bonding surface of the substrate layer 205. Having a layer of traps at this surface can be beneficial by preventing inversion or accumulation of free carriers at this surface. Another benefit of forming the trap rich layer 214 after thermal oxidation is that thermal oxidation requires high temperatures and long times which can result in annealing and degradation of previously created traps, which is counter to the general goal of high trap density. Also, although the bonding layer 206 could be formed by CVD, in some cases a thermally grown oxide for the bonding layer 206 may have more desirable properties than a CVD oxide.

Another benefit of irradiation for inducing trap formation is that because of the high penetration depth (e.g. of gamma rays), an entire box of wafers (typically 25 wafers in a box) can be irradiated as a batch, which saves time and money. Also, the wafer box can be left sealed during the irradiation procedure, since the radiation can penetrate the box, thereby preventing potential contamination of the wafers. This feature also allows irradiation to take place in an industrial environment, instead of in a clean room, thereby reducing cost and increasing the number of fabrication places that can be used for the procedure.

The irradiation technique could be used on SOI wafers in addition to bulk semiconductor wafers. However, the top semiconductor layer of the SOI wafer would be damaged too. A rapid top surface annealing could repair some of the damage to the top semiconductor layer. However, such annealing may not be allowable if CMOS processing of the top semiconductor layer has already occurred. On the other hand, if the damage to devices made in the top semiconductor layer was acceptable, then the trap creation could take place after CMOS processing without a subsequent repair anneal. This option could be simpler and less expensive than creating a trap rich layer in an SOI wafer before CMOS processing. Irradiation could also be used in combination with other trap generation mechanisms to cause an overall increase in the effective resistivity. For example, after implant the wafer with the trap rich layer could be irradiated before bonding to the second wafer.

Some embodiments may create the trap rich layer 214 by mechanical damage methods inflicted on the surface of the handle substrate layer 205 before the bonding layer 206 is formed. (Similar mechanical damage methods are sometimes done by semiconductor wafer manufacturers for "extrinsic gettering" purposes.) The damage may be caused by any of several methods, such as brushing the surface of the handle substrate layer 205 with a metal or ceramic brush, impinging small balls of hard material onto the surface of the handle substrate layer 205 or grinding the surface of the handle substrate layer 205. The bonding layer 206 can then be deposited on the surface of the handle wafer 201 and planarized with chemical mechanical polishing (CMP) to allow proper fusion bonding to the top exposed surface 212 of the semiconductor wafer 202. Alternatively, a liquid adhesive bonding agent can be applied to the surface of the handle wafer 201, allowing the liquid to smooth out the bonding surface 211 of the handle wafer 201 over the mechanically roughened surface of the handle substrate layer 205.

In some embodiments, since the trap rich layer 214 is part of the handle wafer 201 that is bonded to the semiconductor wafer 202, the trap rich layer 214 is generally added to the semiconductor wafer 202 after most or all of the structures in the active layer 203 have been formed. Consequently, unlike in the prior art described above, the processing or fabrication methods used to form the structures in the active layer 203 generally do not affect the trap rich layer 214.

In various embodiments of the present invention, the bonding layer 206 is provided in variant forms. For example, in some embodiments, the bonding layer 206 consists of two layers of insulator material initially separately bonded to the handle wafer 201 and the semiconductor wafer 202. In some alternative embodiments, the trap rich layer 214 may be present on the top surface of the semiconductor wafer 202 and directly bonded to the handle wafer 201. In this case, the bonding layer 206 is completely absent. Alternatively, the trap rich layer 214 may be present on the semiconductor wafer 202 and covered by a suitable bonding layer 206. In this case, the trap rich layer 214 is between the active layer 203 and the bonding layer 206. In some embodiments, the bonding layer 206 comprises silicon dioxide or any other appropriate type of insulator. In other embodiments, the bonding layer 206 comprises passivation layers and/or other auxiliary layers.

Figure 1:
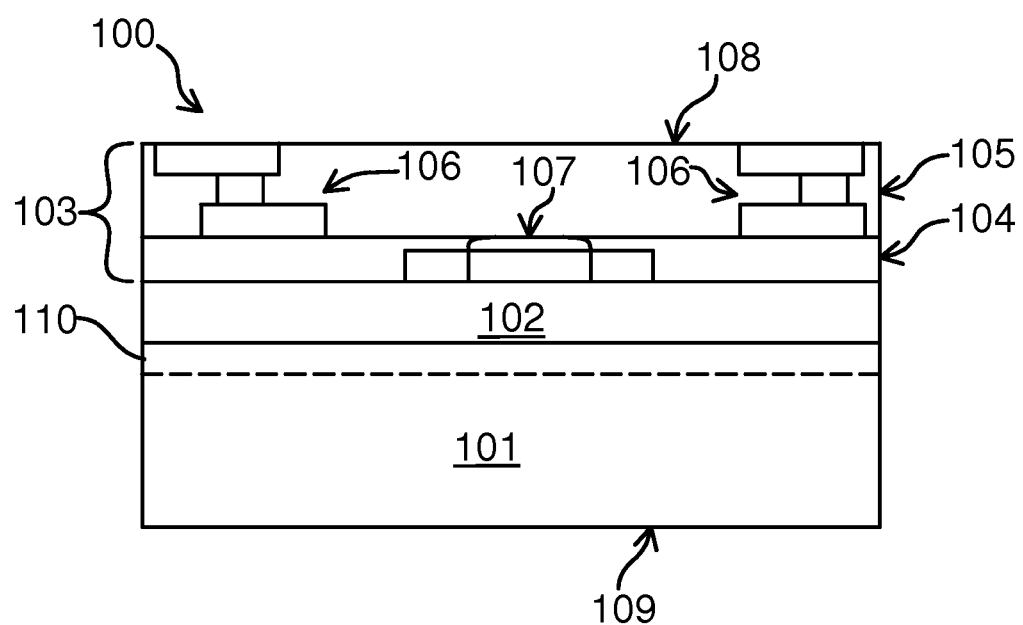
FIG. 1 is a simplified cross section diagram of a prior art SOI structure.

In various embodiments of the present invention, the active layer 203 can be provided in variant forms. In some embodiments, the active layer 203 contains one or more of the transistor 210, e.g. various appropriate combinations of metal oxide semiconductor (MOS) devices, bipolar devices, vertical diffused MOS (VDMOS) power devices, etc. Various forms of the transistor 210 generally comprise a gate region 215 and a body/channel region 216. In some embodiments of the present invention, the gate region 215 is between the body/channel region 216 and the trap rich layer 214. Also, in some embodiments of the present invention, the metal wiring 209 of the metal interconnect layer 208 is between the body/channel region 216 and the trap rich layer 214. These embodiments generally exhibit an advantageous characteristic in that the active device material forming the source, drain, and channel of the active devices in the active device layer 207 (e.g. the transistor 210) is further separated from the handle substrate layer 205 (compared to the active device layer 104 and the substrate layer 101 of FIG. 1), thereby improving the RF performance of the active devices as described above.

The previously described advantageous characteristic is enhanced in embodiments where the active device layer 207 is at the bottom of the active layer 203 and the active regions are contacted only by the lowest layer of metal in the metal interconnect layer 208. In other embodiments of the present invention, part or all of the metal interconnect layer 208 is added below the insulator layer 204, e.g. after the original underlying substrate material of the semiconductor wafer 202 is removed or thinned. In this case, the active device layer 207 is not as far separated from the handle substrate layer 205 as in the previously described embodiment. However, the thickness of the bonding layer 206 may be chosen to ensure a greater beneficial separation between the active device layer 207 and the handle substrate layer 205 compared to the active device layer 104 and the substrate layer 101 of FIG. 1.

In some embodiments of the present invention, the single structure 200 comprises multiple trap rich layers. For example, the structure 200 could comprise a trap rich layer below the insulator layer 204 in addition to the trap rich layer 214. This additional trap rich layer may be formed according to the prior art described above or in accordance with embodiments described with reference to FIG. 5 below. In another example, the single structure 200 could comprise multiple active layers 203 (or active device layers 207) that are separated by trap rich layers in addition to the overlying trap rich layer 214. In addition to the mitigation of intra-layer cross talk as described above, these embodiments generally exhibit the additional advantageous characteristic of improving isolation between signals located in different active layers 203. This characteristic is of particular importance in situations where passive devices such as inductors are located in one of the active layers 203 because it is desirous to provide good isolation between these devices and the active devices in the active device layer(s) 207. The improved isolation thus formed by the trap rich layer(s) can additionally allow the passive devices to be closer to the active devices (e.g. the transistor 210) to thereby reduce parasitic capacitance while still maintaining a given desirable degree of isolation.

Figure 3:
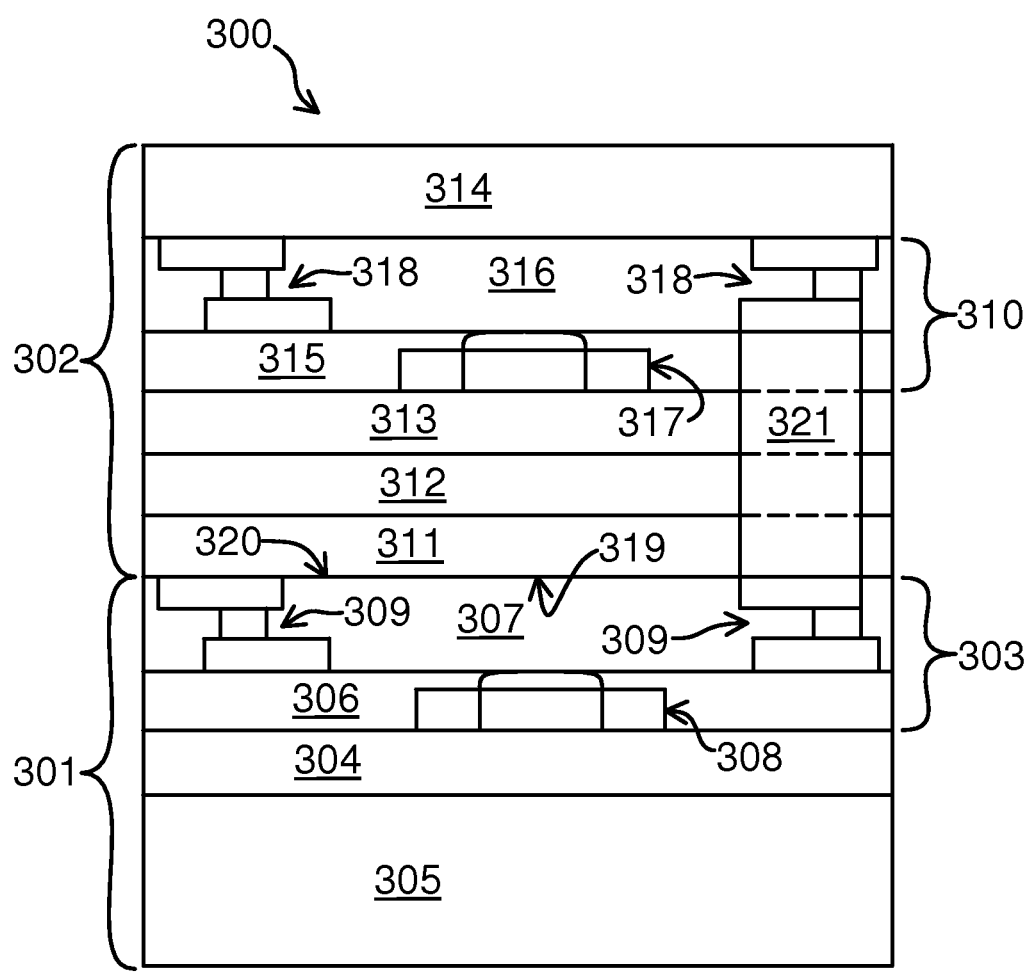
FIG. 3 is a simplified cross section diagram of a portion of a second IC chip showing example structures therein that incorporate another embodiment of the present invention.

Some embodiments of the present invention can be described with reference to FIG. 3. FIG. 3 illustrates a structure 300 having multiple layers of signal processing circuitry. The structure 300 generally includes a semiconductor wafer 301 and a handle (or second semiconductor) wafer 302 bonded together by wafer bonding or layer transfer techniques.

The semiconductor wafer 301 generally includes an active layer 303, an insulator (e.g. an oxide or other dielectric) layer 304 and a substrate layer 305. The semiconductor wafer 301 is optionally capped by another insulator layer (not shown). The active layer 303 generally includes an active device layer 306 and a metallization or metal interconnect layer 307. The active layer 303 thus also generally includes signal processing circuitry, such as one or more active devices (e.g. a transistor 308) in the active device layer 306 and metal wiring 309 in the metal interconnect layer 307.

The handle wafer 302 generally includes an active layer 310, a bonding layer 311, a trap rich layer 312, and underlying and overlying insulator (e.g. an oxide or other dielectric) layers 313 and 314. The active layer 310 generally includes an active device layer 315 and a metallization or metal interconnect layer 316. The active layer 310 thus also generally includes signal processing circuitry, such as one or more active devices (e.g. a transistor 317) in the active device layer 315 and metal wiring 318 in the metal interconnect layer 316. The handle wafer 302 is, thus, a second semiconductor wafer in this embodiment.

According to various embodiments, the trap rich layer 312 is formed after the formation of one or both of the active layers 303 and 310. Additionally, the trap rich layer 312 is interposed between the two wafers 301 and 302 on the top side of the semiconductor wafer 301. Furthermore, the trap rich layer 312 may have any one or more of the characteristics and may be formed by any of the techniques described herein for the trap rich layer 214 (FIG. 2), depending on the requirements of a desired configuration or implementation.

In some embodiments, the handle wafer 302 is formed from an SOI or bulk semiconductor wafer. Accordingly, in some embodiments, the trap rich layer 312 is formed within a semiconductor substrate of the handle wafer 302 prior to the formation of the active layer 310. In this case, however, the subsequent formation of the structures in the active layer 310 may degrade the trap rich layer 312, as mentioned above. However, the formation of the active layer 303 in the semiconductor wafer 301 generally does not affect the trap rich layer 312, since the trap rich layer 312, as part of the handle wafer 302, is added to the semiconductor wafer 301 after the formation of the active layer 303.

In other embodiments, the trap rich layer 312 is formed after the formation of the active layer 310. For example, the trap rich layer 312 may be high resistivity material deposited onto a bottom surface of the insulator layer 313, e.g. after an additional handle wafer (not shown) is bonded to the top of the handle wafer 302 and the underlying semiconductor substrate is removed or thinned to expose the insulator layer 313. Alternatively, the underlying semiconductor substrate is not fully removed, and the trap rich layer 312 is formed in the remaining portion of the underlying semiconductor substrate, e.g. by implantation of high energy particles to create a damaged area in the underlying semiconductor substrate, as mentioned above. The additional handle wafer is subsequently removed either before or after the handle wafer 302 is bonded to the semiconductor wafer 301. In variations of these embodiments, the additional handle wafer is optional or the overlying insulator layer 314 originates as part of the bonding layer used to bond the additional handle wafer to the handle wafer 302. In each case, the formation of the active layer 303 in the semiconductor wafer 301 generally does not affect the trap rich layer 312, since the trap rich layer 312, as part of the handle wafer 302, is added to the semiconductor wafer 301 after the formation of the active layer 303. In other alternatives, the additional handle wafer remains attached to the handle wafer 302 immediately after bonding the semiconductor wafer 301 and the handle wafer 302, and then either the additional handle wafer or the substrate layer 305 is removed or thinned.

In other alternative embodiments, the trap rich layer 312 is added to the handle wafer 302 by layer transfer techniques after the formation of the active layer 310. (See the dual layer transfer technique described below with reference to FIG. 5.) Thus, the trap rich layer 312 is formed as a layer in (or as the entire extent of) another handle wafer. The other handle wafer is then bonded to the handle wafer 302, e.g. with the insulator layer 313 (formed on either the other handle wafer or the handle wafer 302) serving as a bonding layer. Then any unnecessary thickness of the other handle wafer is removed, leaving the trap rich layer 312 as part of the handle wafer 302. Additionally, the bonding layer 311 may be formed in the other handle wafer along with the trap rich layer 312 before bonding the trap rich layer 302 to the handle wafer 302, or the bonding layer 311 may be formed on the trap rich layer 312 after such bonding (and optionally after the removal of any unnecessary thickness of the other handle wafer). Some of these embodiments generally enable the use of a low cost polysilicon wafer, or the use of radiation damaging techniques, to form the trap rich layer 312 in the other handle wafer. In each case, the formation of the active layer 303 in the semiconductor wafer 301 generally does not affect the trap rich layer 312, since the trap rich layer 312, as part of the handle wafer 302, is added to the semiconductor wafer 301 after the formation of the active layer 303.

In other embodiments, the trap rich layer 312 is added to the semiconductor wafer 301, instead of to the handle wafer 302 (after the active layer 303 is formed, but before the semiconductor wafer 301 and the handle wafer 302 are bonded together). In this case, the bonding layer 311 is an insulating layer, and the insulating layer 313 is a bonding layer. Additionally, the active layer 310 may be formed before the bonding, so the formation of neither active layer 303 nor 310 affects the trap rich layer 312.

The bonding layer 311 can generally be a combination of one or more insulator layers and passivation layers used to isolate and protect the active layers 303 and 310. The bonding layer 311 may also be a material used to bond a bottom exposed surface 319 of the handle wafer 302 to a top exposed surface 320 of the semiconductor wafer 301 during the wafer bonding or layer transfer procedure. In some embodiments, the bonding layer 311 comprises an etch-stop layer used when removing material (e.g. part or all of an underlying substrate layer) from the handle wafer 302 as described below. In other embodiments, the bonding layer 311 comprises a substrate material of the handle wafer 302 that was not fully removed when the handle wafer 302 was prepared for bonding to the semiconductor wafer 301 as described below. In another alternative, the bonding layer 311 is added to the semiconductor wafer 301, instead of to the handle wafer 302, before wafer bonding or layer transfer.

In some embodiments, the signal processing circuitry in the active layer 310 of the handle wafer 302 is connected to the signal processing circuitry in the active layer 303 of the semiconductor wafer 301 through a metal-to-metal bond formed by a metal contact 321 between the metal wiring 309 and 318 in the metal interconnect layers 307 and 316. The metal contact 321 may thus be stacked metal layers formed by conventional CMOS metallization processes. Although a connection through the trap rich layer 312 may slightly decrease its efficacy, the benefits accruing from the use of a trap rich layer as described above will still be realized by this structure 300.

In various embodiments of the present invention, the wafers 301 and 302 that are on either side of the trap rich layer 312 may exhibit variant characteristics. In some embodiments of the present invention, the active layer 310 consists of passive devices such as inductors that are used for RF signal processing. The insulator layers 313 and 314 may be comprised of insulator material and passivation material meant to isolate the signal processing devices in the active layer 310. Also, in some embodiments of the present invention, additional layers (e.g. additional handle wafers) having other signal processing circuitry may overlay the handle wafer 302. Each such additional layer may also have an additional trap rich layer (e.g. similar to the trap rich layer 312) interposed between the additional layer and the underlying remainder of the structure 300.

Figure 4:
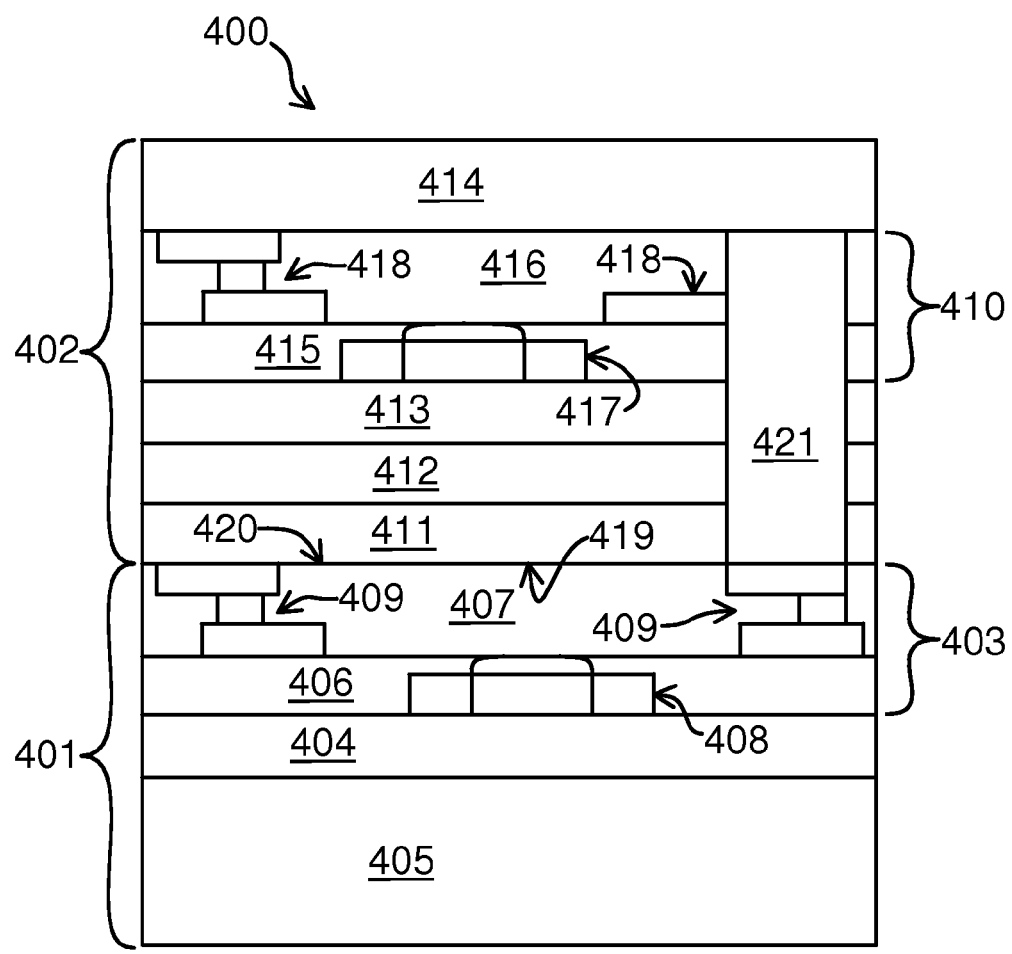
FIG. 4 is a simplified cross section diagram of a portion of a third IC chip showing example structures therein that incorporate another embodiment of the present invention.

Some embodiments of the present invention can be described with reference to FIG. 4. FIG. 4 illustrates a layer transfer structure 400 generally having multiple layers of signal processing circuitry among elements 401-420 (e.g. having similar descriptions as, but not necessarily being identical to, elements 301-320, respectively, of FIG. 3).

The trap rich layer 412 is generally interposed between the active layers 403 and 410, as described above with respect to elements 303, 310 and 312. The trap rich layer 412 may have any one or more of the characteristics and may be formed by any of the techniques described herein for the trap rich layer 214 or 312, depending on the requirements of a desired configuration or implementation.

Additionally, the multiple layers of signal processing circuitry in FIG. 4 may be connected between the metal wiring 409 and 418 within the metal interconnect layers 407 and 416 of the stacked wafers 401 and 402, respectively, using a through semiconductor via (TSV) connection 421. The TSV connection 421 can be etched down through multiple layers of the stacked wafer 401 and 402 as needed, including through existing metallization, to which the TSV connection 421 can electrically connect. For example, the TSV connection 421 connects to circuitry in the active layer 410 of the handle (or second semiconductor) wafer 402 through a lateral contact (e.g. one or more portions of the metal wiring 418) and to circuitry in the active layer 403 of the semiconductor wafer 401 through a bottom contact (e.g. one or more portions of the metal wiring 409). The function of the lateral contact (418) can be implemented using metal sidewalls or platforms in the active layer 410. The TSV connection 421 generally allows for relatively easy connection of additional active layers (e.g. of additional handle wafers) that may overlay the active layer 410 in a fashion similar to that of the handle wafer 402 overlaying the semiconductor wafer 401, with additional trap rich layers interposed between each additional active layer and the underlying active layer.

Additionally, as before, the structure 400 may be capped by the insulator layer 414 which may help to isolate the signal processing circuitry in the active layer 410. The insulator layer 414 may comprise layers of passivation and insulator material.

Figure 5:
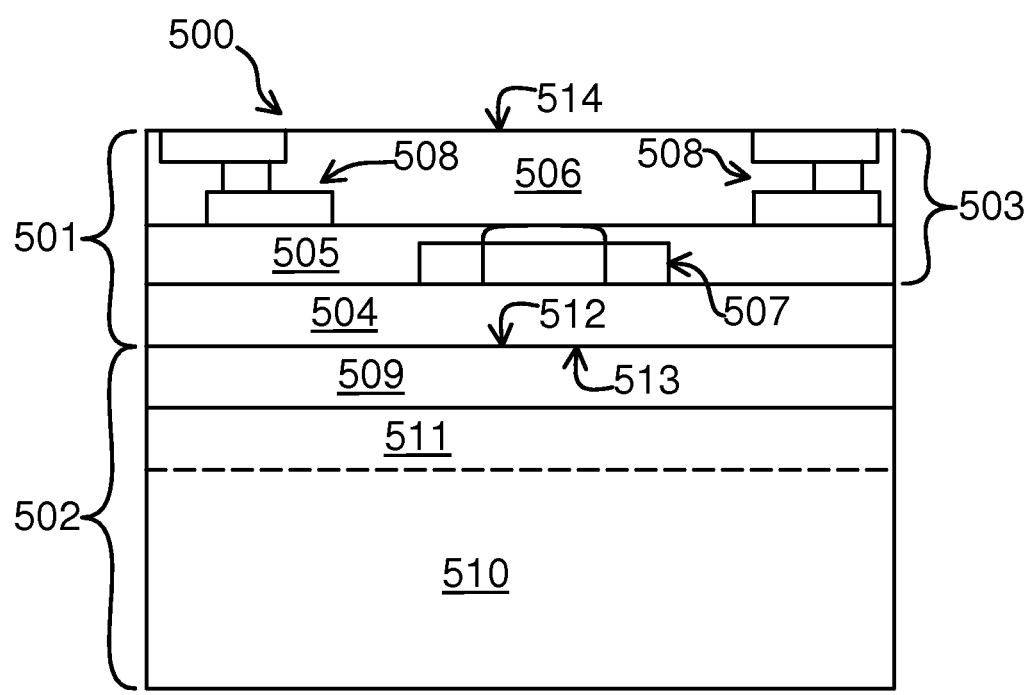
FIG. 5 is a simplified cross section diagram of a portion of a fourth IC chip showing example structures therein that incorporate another embodiment of the present invention.

Some embodiments of the present invention can be described with reference to FIG. 5. FIG. 5 illustrates a layer transfer structure 500 generally having a semiconductor wafer 501 bonded to a handle wafer 502.

The semiconductor wafer 501 generally has an active layer 503 and an insulator (e.g. an oxide or other dielectric) layer 504. The active layer 503 generally includes an active device layer 505 and a metallization or metal interconnect layer 506. The active device layer 505 generally has various active devices 507, such as various types of transistors. Additionally, the metal interconnect layer 506 generally has metal wiring 508. Furthermore, an insulating cap layer (not shown) may be formed on the top of the metal interconnect layer 506.

The handle wafer 502 generally has a bonding layer 509 and a substrate layer 510. The substrate layer 510 may include a trap rich layer 511 therein. The trap rich layer 511 may have any one or more of the characteristics and may be formed by any of the techniques described herein for the trap rich layers 214, 312 or 412, as may be appropriate or allowable depending on the requirements of a desired configuration or implementation. Additionally, the trap rich layer 511 may comprise only a portion of the substrate layer 510 (as shown) or the entire substrate layer 510.

The bonding layer 509 may have any one or more of the characteristics and may be formed by any of the techniques described herein for the bonding layers 206, 311 or 411, as may be appropriate or allowable depending on the requirements of a desired configuration or implementation. The bonding layer 509 generally bonds a top surface 512 of the handle wafer 502 to a bottom surface 513 of the semiconductor wafer 501. As an alternative, the bonding layer 509 may be formed on the bottom surface 513 of the semiconductor wafer 501, instead of on the handle wafer 502.

In some embodiments, the structure 500 is formed by a dual layer transfer or wafer bonding technique. In this case, after most or all of the processing to form the structures in the active layer 503, a temporary handle wafer (not shown) is bonded to a top surface 514 of the semiconductor wafer 501. The temporary handle wafer generally provides structural support for the semiconductor wafer 501 so that part or all of a semiconductor layer (not shown) underlying the insulator layer 504 can be removed. Then the handle wafer 502 is bonded to the bottom surface 513 of the semiconductor wafer 501, and part or all of the temporary handle wafer is removed. Any remaining part of the temporary handle wafer may, for example, form the insulating cap layer (not shown) on the top of the metal interconnect layer 506.

The general result of embodiments in accordance with FIG. 5 is that the structure 500 bears a greater resemblance to the prior art structure 100 (FIG. 1) than do the embodiments that accord with FIGS. 2, 3 and 4. This resemblance generally relates to the positioning of the trap rich layer 511 below, rather than above, the active layer 503. However, the difference in fabrication techniques enables some advantageous differences for the structure 500 compared to the prior art structure 100. For example, since the handle wafer 502 is bonded to the semiconductor wafer 501 after the formation of the active layer 503, the trap rich layer 511 is generally unaffected by the formation of the structures in the active layer 503. The trap rich layer 511 is thus generally subject to much less risk of degradation than is the prior art trap rich layer in region 110 due to any subsequent processing. Additionally, as mentioned above with respect to the insulator layer 204 and the bonding layer 206 of FIG. 2, the bonding layer 509 can generally be made of an insulating material that is considerably thicker than the insulator layer 504. The relatively large thickness of the bonding layer 509 generally ensures a greater beneficial separation between the active device layer 505 and the substrate layer 510 compared to that of the active device layer 104 and the substrate layer 101 of FIG. 1. Therefore, since the substrate layer 510 is relatively far away from the active device layer 505, the effect of parasitic pathways and nonlinear capacitance is significantly lessened compared to that of the prior art structure 100. Additional advantages of the structure 500 may also be apparent.

In some variations on embodiments in accordance with FIG. 5, the structure 500 is generally an intermediary structure in a process for forming the structure 300 or 400 of FIG. 3 or 4. In this case, the substrate layer 510 is thinned or removed, and a bonding layer (e.g. 311 or 411) is formed on a bottom surface thereof in preparation for bonding to another semiconductor wafer (e.g. 301 or 401) having another active layer (e.g. 303 or 403). The active layer 503 is thus either active layer 310 or 410. Additionally, the trap rich layer 511 is thus either trap rich layer 312 or 412 and is formed after the active layers 303 and 310 or 403 and 410. The trap rich layer 511 is thus unaffected by the formation of either active layer 303 and 310 or 403 and 410.

In the prior art, an attempt has been made to form devices and material layers in a wafer, attach a support on top of the wafer, remove or thin portions of the wafer that underlie the devices and material layers, bond a substrate to the bottom of the wafer, and remove the top mounted support. The bottom mounted substrate has an insulator layer (such as silicon nitride or silicon oxide) on its bonding surface and comprises Au, Ag, or Li doped silicon that forms a high resistivity silicon substrate with deep level trapping sites under the insulator layer. However, the techniques described herein for forming the trap rich layer 511 generally produce a significantly higher trap density than is possible with this prior art technique. Therefore, embodiments in accordance with FIG. 5 have this significant advantage over this prior art technique. Also, Au, Ag and Li are generally considered harmful contaminants in almost all semiconductor fabrication facilities. Therefore, it is generally undesirable for wafers doped with these elements to be processed in most facilities due to concerns with cross-contamination to other processes.

Figure 6:
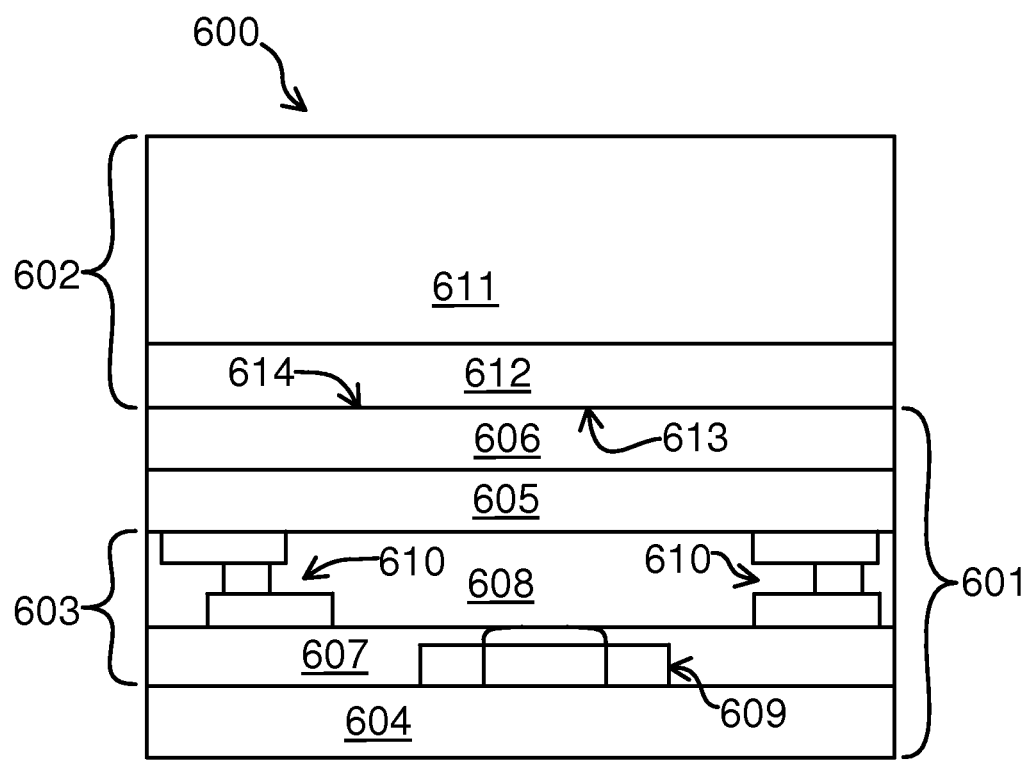
FIG. 6 is a simplified cross section diagram of a portion of a fifth IC chip showing example structures therein that incorporate another embodiment of the present invention.

Some embodiments of the present invention can be described with reference to FIG. 6. FIG. 6 illustrates a layer transfer structure 600 generally having a semiconductor wafer 601 bonded to a handle wafer 602.

The semiconductor wafer 601 generally has an active layer 603, underlying and overlying insulator (e.g. an oxide or other dielectric) layers 604 and 605 and a trap rich layer 606.

The active layer 603 generally includes an active device layer 607 and a metallization or metal interconnect layer 608. The active device layer 607 generally has various active devices 609, such as various types of transistors. Additionally, the metal interconnect layer 608 generally has metal wiring 609. Furthermore, an insulating cap layer (not shown) may be formed on the top of the trap rich layer 606. The trap rich layer 606 may have any one or more of the characteristics and may be formed by any of the techniques described herein for the trap rich layers 214, 312, 412 or 511, as may be appropriate or allowable depending on the requirements of a desired configuration or implementation.

The handle wafer 602 generally has a substrate layer 611 and a bonding layer 612. The bonding layer 612 may have any one or more of the characteristics and may be formed by any of the techniques described herein for the bonding layers 206, 311, 411 or 509, as may be appropriate or allowable depending on the requirements of a desired configuration or implementation. The bonding layer 612 generally bonds a bottom surface 613 of the handle wafer 602 to a top surface 614 of the semiconductor wafer 601. As an alternative, the bonding layer 612 may be formed on the top surface 614 of the semiconductor wafer 601, instead of on the handle wafer 602.

The trap rich layer 606 is generally between the active layer 603 of the semiconductor wafer 601 and the substrate layer 611 of the handle wafer 602. Additionally, the trap rich layer 606 is formed after most or all of the structures of the active layer 603, so the trap rich layer 606 is generally unaffected by the formation of the structures in the active layer 603. Therefore, even though the trap rich layer 606 is formed on the semiconductor wafer 601, rather than on the handle wafer 602, the trap rich layer 606 is generally subject to much less risk of degradation than is the prior art trap rich layer in region 110 due to any subsequent processing.

Figure 7:
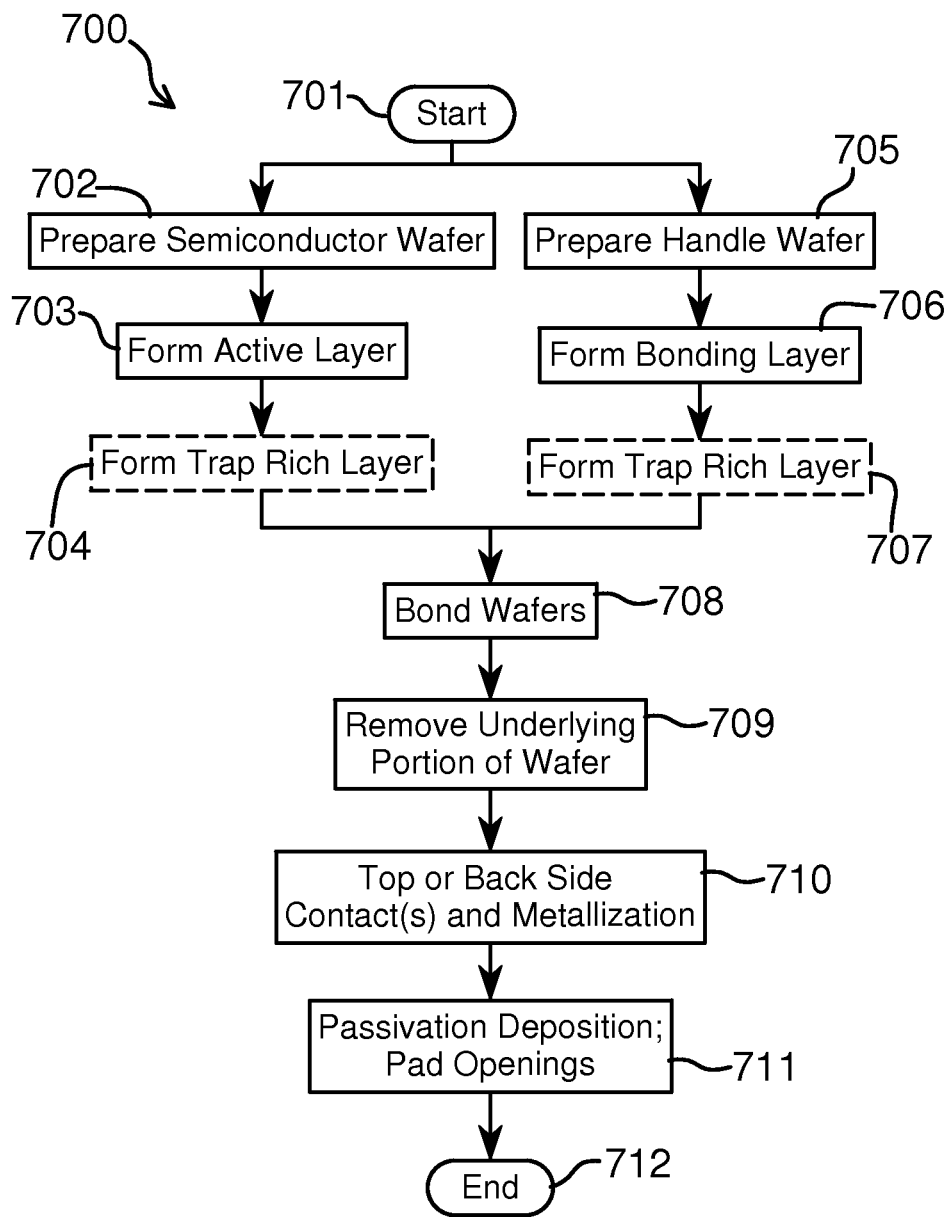
FIG. 7 is a simplified flow chart for an example process for fabricating one or more of the structures shown in FIGS. 2 and 6, according to embodiments of the present invention.

FIG. 7 shows a flowchart for a process 700 for fabricating at least part of an integrated circuit chip (e.g. similar to structure 200 or 600, FIG. 2 or 6), according to some embodiments of the present invention. It is understood, however, that the specific process 700 is shown for illustrative purposes only and that other embodiments (in addition to specifically mentioned alternative embodiments) may involve other processes or multiple processes with other individual steps or a different order or combination of steps and still be within the scope of the present invention.

Upon starting (at 701), the semiconductor wafer 202 or 601 is prepared at 702. If the semiconductor wafer 202 or 601 is an SOI wafer, then the preparation (at 702) may simply be to provide a standard SOI wafer. If the semiconductor wafer 202 or 601 is a bulk semiconductor wafer, then the preparation (at 702) may include creating a buried P+ layer in the bulk semiconductor wafer 202 or 601, e.g. by epitaxial growth or ion implantation methods. Epitaxial methods may involve epitaxially depositing a layer of P+ material on a P− or N− substrate. Then a layer of lightly-doped silicon may be epitaxially deposited to use as an active device layer. This layer may be thick enough so that up-diffusion from the P+ layer does not reach the active device layer 207 or 607 by the end of processing to form the structures in the active layer 203 or 603. Ion implantation methods, on the other hand, may involve performing a high-dose, high-energy ion (e.g. Boron, etc.) implant into the surface of the bulk semiconductor wafer, forming a buried P+ layer deep enough so it will not diffuse up to the active device layer 207 or 607 during processing to form the structures in the active layer 203 or 603.

At 703, the active layer 203 or 603 is formed to produce a circuit with a set of active devices in the semiconductor wafer 202 or 601. For an SOI wafer, the active layer 203 or 603 may be manufactured using a standard SOI process. For a bulk semiconductor wafer, the active layer 203 or 603 may be formed with a process that provides an etch stop for a subsequent substrate removal, such as the aforementioned P+ layer formed below the active device layer. Additionally, a chemical mechanical polishing is optionally performed of the top surface of the semiconductor wafer 202 or 601.

For embodiments according to FIG. 6, the trap rich layer 606 is formed (at 704) on the semiconductor wafer 601 above, and after the formation of, the active layer 603. Additionally, the insulator (e.g. an oxide or other dielectric) layer 605 may be formed beforehand. Also, an additional dielectric/oxide layer (not shown) may be formed over the trap rich layer 606. The trap rich layer 606, the insulator layer 605 and the additional dielectric/oxide layer may be deposited or epitaxially grown above the active layer 603 or added by layer transfer techniques from another handle wafer. If the trap rich layer 606 is added by layer transfer techniques, then the other handle wafer is processed separately to form the trap rich layer 606 and any adjacent dielectric or insulator layers. In this case, for example, the trap rich layer 606 may be polycrystalline semiconductor on dielectric on substrate or damaged single crystal top semiconductor on dielectric on substrate. After bonding the other handle wafer to the semiconductor wafer 601, the substrate of the other handle wafer may be removed, e.g. as described herein for removing semiconductor substrate material. The dielectric layer that was under the trap-rich layer 606 is optionally left in place. Additionally, another dielectric layer is optionally deposited on the top surface exposed after removing the semiconductor substrate of the other handle wafer.

If direct bonding is subsequently to be performed to bond the semiconductor wafer 202 or 601 to the handle wafer 201 or 602, the top surface of the semiconductor wafer 202 or 601 may be planarized after 703 or 704. On the other hand, if an adhesive bond is to be performed, then planarization may not be necessary.

Separately from 702-704, the handle wafer 201 or 602 is prepared (at 705). Such preparation may include the formation (at 706) of the bonding layer 206 or 612 and, for embodiments according to FIG. 2, the formation (at 707) of the trap rich layer 214, by any appropriate method or in any appropriate order as described above.

At 708, the handle wafer 201 or 602 is bonded to the top surface of the semiconductor wafer 202 or 601. The bonding may be a direct oxide-oxide bond, an adhesive bond, an anodic bond, a low-temperature glass frit bond, a molecular bond, an electrostatic bond, etc., as appropriate for a given situation. For embodiments according to FIG. 2, therefore, even though the trap rich layer 214 may be formed in the handle wafer 201 at any time before, during or after the formation of the active layer 203 in the semiconductor wafer 202, the trap rich layer 214 is not added to the structure 200 until after the formation of the active layer 203.

At 709, the original underlying, or back side, portion (e.g. a semiconductor substrate) of the semiconductor wafer 202 or 601 is substantially removed or thinned. Most of the semiconductor substrate can be removed by back side grinding. A final portion of the semiconductor substrate can be removed by a wet etch, selective chemical mechanical polishing (CMP), a dry etch, etc., leaving at least the active device layer 207 or 607 (or the insulator layer 204 or 604, if it is part of the original semiconductor wafer 202 or 601). For embodiments using a bulk semiconductor wafer, the original underlying substrate is removed to the P+ layer (described above) using a wet chemical etch that is highly selective to P+ material (for example EDP, KOH, or TMAH). The etch can be either chemical or electro-chemical. Additionally, the P+ layer is optionally removed using any combination of grinding, polishing, CMP, dry etch, or non-selective wet etch. The P+ layer will only be a few microns in thickness, so a much better uniformity of a remaining relatively thin (e.g. less than 1 μm) semiconductor film can be achieved than if the semiconductor wafer 202 or 601 was thinned mechanically. Furthermore, after removing/thinning the various layers or materials at 709, a passivation dielectric layer(s) is optionally deposited on the newly-exposed surface to reduce effects due to moisture and ionic contamination ingress.

At 710, patterned contact and metallization are formed for any top or back side connections (e.g. top or bottom electrodes and contacts, etc., as desired). At 711, various passivation deposition techniques are performed and pad openings are formed, so the overall IC chip can be generally completed with bumps, pillars, or other post-processing metallization. The process 700 then ends at 712.

Figure 8:
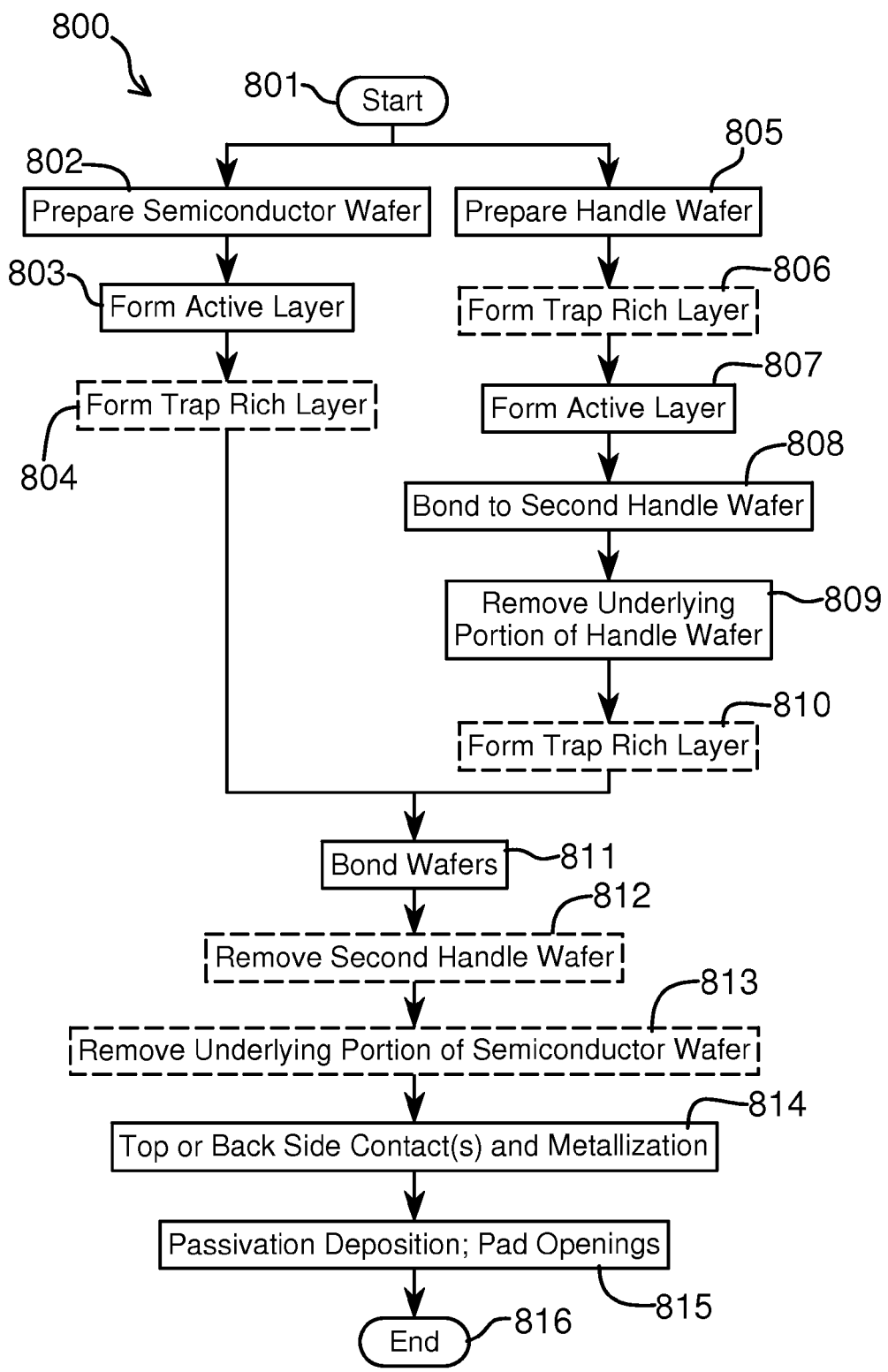
FIG. 8 is a simplified flow chart for an example process for fabricating one or more of the structures shown in FIGS. 3 and 4, according to embodiments of the present invention.

FIG. 8 shows a flowchart for a process 800 for fabricating at least part of an integrated circuit chip (e.g. similar to structure 300 or 400, FIG. 3 or 4), according to some embodiments of the present invention. It is understood, however, that the specific process 800 is shown for illustrative purposes only and that other embodiments (in addition to specifically mentioned alternative embodiments) may involve other processes or multiple processes with other individual steps or a different order or combination of steps and still be within the scope of the present invention.

Upon starting (at 801), the semiconductor wafer 301 or 401 is prepared at 802 and the active layer 303 or 403 is formed at 803. For example, 802 and 803 may be similar to 702 and 703, respectively, as described above for an SOI wafer or a bulk semiconductor wafer. At this point, if an electrical connection is to be made between the semiconductor wafer 301 or 401 and the handle wafer 302 or 402 (e.g. via the metal contact 321), then the semiconductor wafer 301 or 401 has metal exposed with the metal surface coplanar with a top dielectric surface.

Optionally, the trap rich layer 312 or 412 may be formed (at 804) on top of the semiconductor wafer 301 or 401, similar to the formation of the trap rich layer 606 (at 704), as described above, instead of forming the trap rich layer 312 or 412 in the handle (or second semiconductor) wafer 302 or 402, as described below. In this case, since the active layer 303 or 403 is formed before the trap rich layer 312 or 412, the trap rich layer 312 or 412 is unaffected by the processes that form the active layer 303 or 403. Additionally, since the active layer 310 or 410 is formed in the handle wafer 302 or 402 before bonding to the semiconductor wafer 301 or 401, the trap rich layer 312 or 412 is also unaffected by the processes that form the active layer 310 or 410.

If the trap rich layer 312 or 412 is added (at 804) by layer transfer techniques, then another handle wafer is processed separately to form the trap rich layer 312 or 412 and any adjacent dielectric or insulator layers. In this case, for example, the trap rich layer 312 or 412 may be polycrystalline semiconductor on dielectric on substrate or damaged single crystal top semiconductor on dielectric on substrate. After bonding the other handle wafer to the semiconductor wafer 301 or 401, the substrate of the other handle wafer may be removed, e.g. as described herein for removing semiconductor substrate material. The dielectric layer that was under the trap-rich layer 312 or 412 is optionally left in place. Additionally, another dielectric layer is optionally deposited on the top surface exposed after removing the semiconductor substrate of the other handle wafer.

Separately from 802-804, the handle wafer 302 or 402 is prepared (at 805), e.g. similar to 702 or 802, as described above for an SOI wafer or a bulk semiconductor wafer. If the trap rich layer 312 or 412 is not formed at 804, then since the trap rich layer 312 or 412 is below the active layer 310 or 410, the trap rich layer 312 or 412 may optionally be formed (at 806) before the formation (at 807) of the active layer 310 or 410. Since the active layer 303 or 403 is formed in the semiconductor wafer 301 or 401 before bonding to the handle wafer 302 or 402, the trap rich layer 312 or 412 is unaffected by the processes that form the active layer 303 or 403. However, since the subsequent formation of the active layer 310 or 410 could degrade the trap rich layer 312 or 412, the trap rich layer 312 or 412 may be formed from the back side of the handle wafer 302 or 402 after the formation (at 807) of the active layer 310 or 410, as described below at 810.

The active layer 310 or 410 is formed at 807. The active layer 310 or 410 may have active devices, passive devices, or both, depending on the situation or embodiment. The active layer 310 or 410 (or the handle wafer 302 or 402 as a whole) may have similar or different material layer sequences to that of the active layer 303 or 403 (or of the semiconductor wafer 301 or 401 as a whole). Additionally, the active layer 310 or 410 may be based on SOI wafer (e.g. layers including a substrate, a buried oxide and device semiconductor material) or bulk semiconductor wafer (e.g. layers including a lightly doped substrate, a semiconductor layer doped P+ at the surface and device semiconductor material) types of processes, regardless of the types of wafer or processes used to form the active layer 303 or 403.

At 808, a second handle wafer (not shown) is bonded to a top surface of the handle wafer 302 or 402 at least after the formation (at 807) of the active layer 310 or 410 and optionally after the formation (at 806) of the trap rich layer 312 or 412. The second handle wafer may be permanent or temporary, depending on the situation or embodiment.

At 809, the original underlying, or back side, portion (e.g. a semiconductor substrate) of the handle wafer 302 or 402 is substantially removed or thinned. In some respects, this removal may be similar to 709 above. Most of the semiconductor substrate can be removed by back side grinding. A final portion of the semiconductor substrate can be removed by a wet etch, selective chemical mechanical polishing (CMP), a dry etch, etc. If the thickness of the remaining semiconductor material is not a critical parameter, then a mechanical stop may be sufficient.

If the trap rich layer 312 or 412 (or the bonding layer 311 or 411) has already been formed (at 806) in the handle wafer 302 or 402, then the removal/thinning of the underlying portion stops at this point. On the other hand, if the trap rich layer 312 or 412 is not already present, then the removal/thinning stops at least at the active device layer 315 or 415 (or the insulator layer 313 or 413, if it is part of the original handle wafer 302 or 402).

If the trap rich layer 312 or 412 has not been formed at 804 or 806, then the trap rich layer 312 or 412 may be formed at 810. In this case, since the underlying portion of the handle wafer 302 or 402 has been removed or thinned, the trap rich layer 312 or 412 can be formed on the back side of the handle wafer 302 or 402. The trap rich layer 312 or 412 may thus be formed by any appropriate method. If the trap rich layer 312 or 412 is formed by a dual layer transfer or wafer bonding technique as described with respect to FIG. 5, then the underlying substrate layer 510 may be removed or thinned before the handle wafer 302 or 402 is bonded to the semiconductor wafer 301 or 401.

Additionally, in this case, since the active layer 310 or 410 is formed before the trap rich layer 312 or 412 is added to the handle wafer 302 or 402, the trap rich layer 312 or 412 is unaffected by the processes that form the active layer 310 or 410. Furthermore, since the active layer 303 or 403 is formed in the semiconductor wafer 301 or 401 before bonding to the handle wafer 302 or 402, the trap rich layer 312 or 412 is also unaffected by the processes that form the active layer 303 or 403.

Prior to bonding the handle wafer 302 or 402 and the semiconductor wafer 301 or 401, the bonding layer 311 or 411 may be formed on the back side of the handle wafer 302 or 402 (or on the top side of the semiconductor wafer 301 or 401). Additionally, if an electrical connection is to be made between the semiconductor wafer 301 or 401 and the handle wafer 302 or 402 (e.g. via the metal contact 321), then the back side of the handle wafer 302 or 402 is processed to form metal surfaces coplanar with the bottom dielectric surface. The handle wafer 302 or 402 is then bonded to the semiconductor wafer 301 or 401 at 811. If an electrical connection is to be made between the semiconductor wafer 301 or 401 and the handle wafer 302 or 402, then bond may be metal-to-metal, as well as dielectric-to-dielectric.

At 812, the second handle wafer may be removed from the top side of the handle wafer 302 or 402. However, if it is desired to have back side electrical connections (e.g. solder balls, bumps, pillars, etc.) for the structure 300 or 400, then the second handle wafer may be permanently left in place and an underlying portion of the insulator layer 305 or 405 may be removed or thinned (at 813).

The process 800 may optionally repeat 805-812 to stack additional active layers onto the structure 300 or 400. Each additional active layer may have a trap rich layer between it and the preceding underlying active layer. Additionally, active layers between two other active layers may have the metal contact 321 or the TSV connection 421 to electrically connect to at least one of the two other active layers.

At 814, patterned contact and metallization are formed for any top or back side connections (e.g. top or bottom electrodes and contacts, etc., as desired). In some embodiments, material layers may also be optionally etched from the exposed top or back side surface through one of the active layers 403 or 410 to the other active layer 410 or 403; thereby exposing metal (e.g. metal sidewalls and/or shelves) in the metal interconnect layer 407 or 416 through a deep hole or trench. The hole or trench may be filled with metal to form the TSV connection 421 to interconnect the active layers 403 and 410 together and optionally to provide an electrical connection to the active layers 403 and/or 410 from a source external to the structure 400.

At 815, various passivation deposition techniques are performed and pad openings are formed, so the overall IC chip can be generally completed with bumps, pillars, or other post-processing metallization. The process 800 then ends at 816.

Some embodiments of the present invention described above exhibit an advantageous aspect in that the efficacy of the trap rich layer 214, 312, 412, 511 or 606 is generally not mitigated by further semiconductor processing. As described above, in specific embodiments of the present invention the trap rich layer 214, 312, 412, 511 or 606 is formed on the top surface of the semiconductor wafer 202, 301, 401, 501 or 601 or is provided by the handle wafer 201, 302, 402, 502 or 602 after the semiconductor wafer 202, 301, 401, 501 or 601 has undergone active layer processing. By introducing the trap rich layer 214, 312, 412, 511 or 606 after active layer processing is complete, the efficacy of the trap rich layer 214, 312, 412, 511 or 606 is preserved to a greater degree. Although bonding processes will sometimes require increased temperatures, these processes typically only require temperatures of 200° C. to 400° C. which will have a much more benign effect on the number of traps that are present in the trap rich layer 214, 312, 412, 511 or 606.

Some embodiments of the present invention described above exhibit an advantageous aspect in that the trap rich layer 214, 312, 412, 511 or 606 does not interfere with the production and composition of the insulator layer 204, 304, 313, 404, 413, 504 or 604 and the active layer 203, 303, 310, 403, 410, 503 or 603. In the prior art approaches (e.g. FIG. 1), the trap rich layer (e.g. in region 110) is formed below the insulator layer 102 and the insulator layer 102 is then grown or deposited on top of the trap rich layer in region 110. The uniformity of the insulator layer is of critical importance for the performance of the active devices in the active layer of the overall structure. Also, the uniformity of the insulator layer will affect the flatness of the surface of the overall structure if it is used in a layer transferred structure, and the flatness of the surface of the overall structure is important for wafer bonding. Due to the tight constraints placed on the insulator layer, the trap rich layer must also be extremely planar or other significant manufacturing processes must be employed to correct for irregularities in the insulator layer as it is formed over the trap rich layer. In addition, pin holes in the insulator layer can be disastrous in terms of their effect on the performance of devices in the active layer. The introduction of the trap rich layer at a later stage eliminates both of these concerns. First, the uniformity of the bonding layer has a much smaller effect on the performance of the circuitry in the active layer as compared to the uniformity of the insulator layer so the manufacturing process used with relation to these two layers can be significantly relaxed as compared to the prior art. In addition, if the trap rich layer causes pin holes in any insulating layer that is part of the bonding layer, they will not affect the circuit because the top surface of the semiconductor wafer is also generally covered in an insulator that will shield the circuitry located therein.

In some embodiments of the present invention, variations on the process 700 or 800 can be used to produce structures having multiple trap rich layers. Process flows used to produce a structure with multiple trap rich layers can be very similar to those described above. In some embodiments of the present invention, the process 700 or 800 can begin with the provisioning of a semiconductor wafer having a trap rich layer below the insulator layer 204, 304, 404 or 604. As a result, the final layer transferred structure 200, 300, 400 or 600 will have a top side (or intermediate) trap rich layer 214, 312, 412 or 606 and a back side trap rich layer (not shown).

Figure 9:
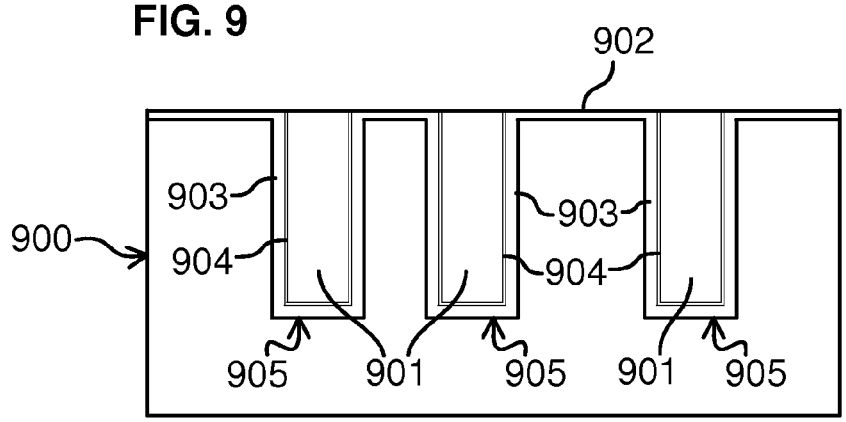
FIG. 9 is a simplified cross section diagram of a portion of a semiconductor substrate with through-semiconductor-vias (TSVs) that may be used with an embodiment of the present invention.
Figure 10:
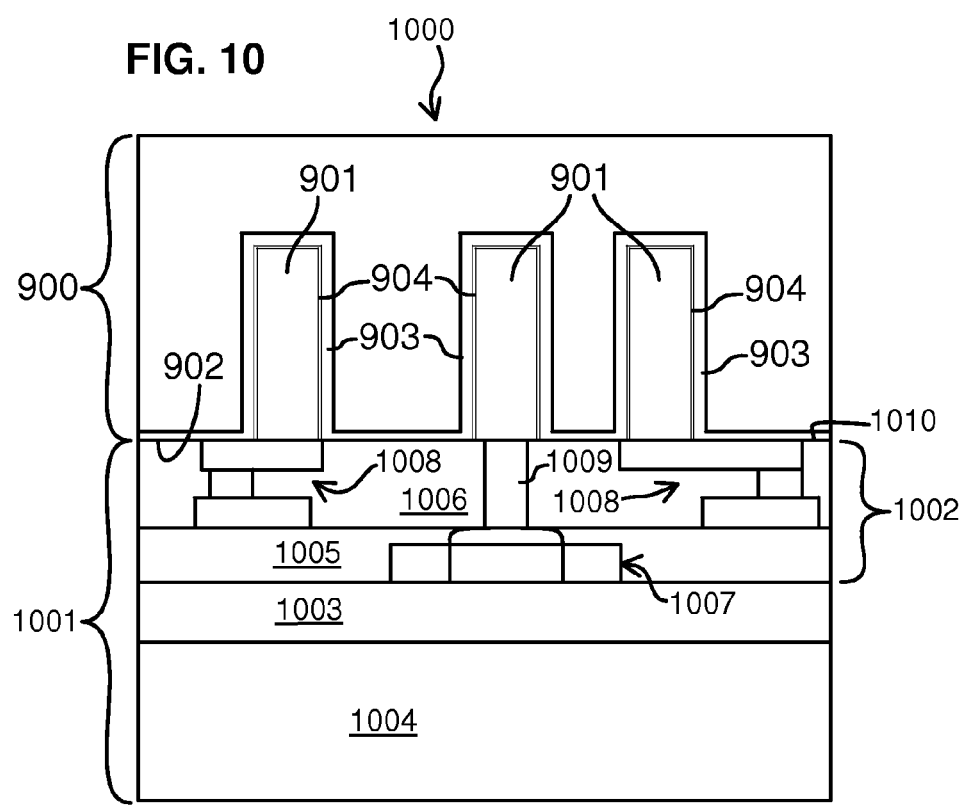
FIG. 10 is a simplified cross section diagram of a portion of a sixth IC chip including the semiconductor substrate shown in FIG. 9 bonded therein in accordance with another embodiment of the present invention.
Figure 11:
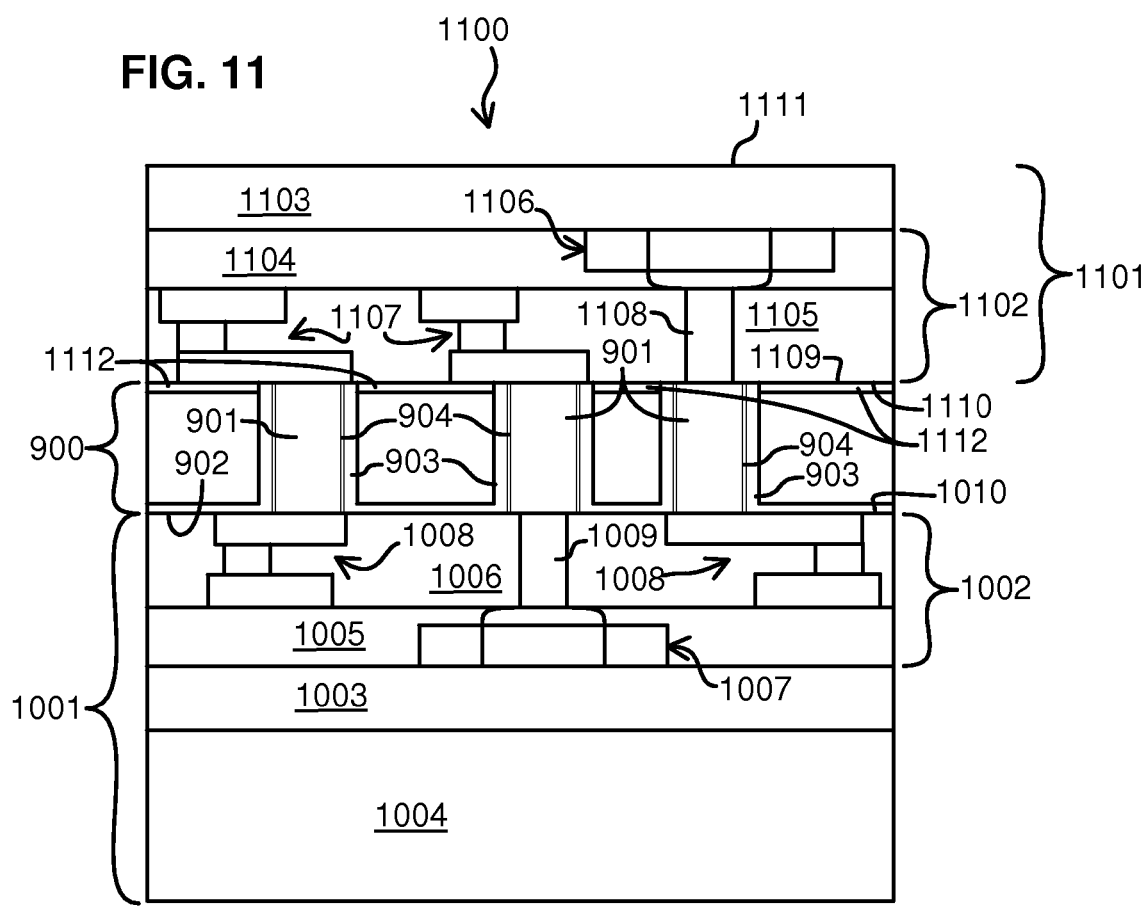
FIG. 11 is a simplified cross section diagram of a portion of a seventh IC chip including the semiconductor substrate shown in FIG. 9 bonded therein in accordance with another embodiment of the present invention.

FIGS. 9-11 illustrate embodiments in which trap rich layers (TRLs) are combined with through-semiconductor-vias (TSVs) in a layer transfer structure. The semiconductor material may be any appropriate material, such as silicon, germanium, etc. Some portions of the semiconductors commonly contain free electronic carriers (holes and electrons) that can form a parasitic coupling path when influenced by a nearby electric field. The TRLs generally trap free carriers in the semiconductor material that would otherwise respond to an electric field from energized devices (active or passive). In general, the TSVs are enhanced with TRLs by placing a conformal layer of trap rich material on a semiconductor wafer containing TSVs after TSV etching but before TSV isolation deposition and conductive material fill. This technique may be used with almost any semiconducting substrate containing free carriers.

FIG. 9 shows a portion of a semiconductor substrate (a TRL-enhanced TSV wafer or "interposer") 900 with TSVs 901 that may be used with an embodiment of the present invention. The TSVs 901 (e.g. metal, doped polysilicon, etc.) are formed within TSV holes 905 that extend from a top surface 902 of the substrate 900 into the interior thereof. The TSVs 901 are surrounded by a trap rich layer 903. (Although the trap rich layer 903 is shown formed on the entire sidewalls and the bottom of the TSV holes 905, in some embodiments, the trap rich layer 903 extends only partially down the sidewalls and/or does not cover the bottom of the TSV holes 905.) In some embodiments, an isolation material 904 separates the TSVs 901 from the trap rich layer 903. In some embodiments, the TSVs 901 may be in direct contact with the trap rich layer 903. An additional oxide layer (not shown) may be deposited over the structure if appropriate for the particular embodiment.

FIG. 10 shows a portion of a sixth IC chip 1000 in accordance with an embodiment of the present invention. The IC chip 1000 generally includes the semiconductor substrate 900 (inverted) and a semiconductor wafer 1001. The semiconductor wafer 1001 generally includes an active layer 1002, an insulator (e.g. an oxide or other dielectric) layer 1003 and a substrate layer 1004. (Alternatively, the wafer 1001 is an insulating wafer and/or includes an IPD circuit layer, as mentioned above.) The active layer 1002 generally includes an active device layer 1005 and a metallization or metal interconnect layer 1006. The active layer 1002 thus also generally includes signal processing circuitry, such as one or more active devices (e.g. a transistor 1007) in the active device layer 1005 and metal wiring 1008 and vias 1009 in the metal interconnect layer 1006. The top surface 902 of the inverted substrate 900 is bonded to a top surface 1010 of the semiconductor wafer 1001 by wafer bonding or layer transfer techniques, e.g. as described herein. The IC chip 1000 can thus be referred to as a layer transfer structure. Additionally, the TSVs 901 are in electrical contact with the metal wiring 1008 and vias 1009.

FIG. 11 shows a portion of a seventh IC chip 1100 in accordance with an embodiment of the present invention. The IC chip 1100 generally includes the semiconductor substrate 900 (inverted and thinned), the semiconductor wafer 1001 and a second semiconductor wafer 1101 (inverted and thinned). The second semiconductor wafer 1101 generally includes an active layer 1102, an insulator (e.g. an oxide or other dielectric) layer 1103. The active layer 1102 generally includes an active device layer 1104 and a metallization or metal interconnect layer 1105. The active layer 1102 thus also generally includes signal processing circuitry, such as one or more active devices (e.g. a transistor 1106) in the active device layer 1104 and metal wiring 1107 and vias 1108 in the metal interconnect layer 1105. A bottom exposed surface or edge 1109 of the inverted substrate 900 is bonded to a top surface or edge 1110 of the inverted second semiconductor wafer 1101 by wafer bonding or layer transfer techniques, e.g. as described herein. The IC chip 1100 can thus be referred to as a layer transfer structure.

The TSVs 901 are in electrical contact with the metal wiring 1107 and vias 1108, thereby providing an electrically conductive path between the metal wiring 1107 and vias 1108 of the inverted second semiconductor wafer 1101 and the metal wiring 1008 and vias 1009 of the first semiconductor wafer 1001. In this manner, a TRL-enhanced TSV wafer (e.g. 900) can be used as an interposer between any two circuit layers (e.g. CMOS, integrated passive components, etc.). Using TRL-enhanced TSV wafers to connect any number of semiconductor wafers can help to ensure that the semiconductor materials within the semiconductor wafers are isolated from the various active and passive devices by TRLs, thereby providing high isolation from non-linear substrate mechanisms.

The inverted second semiconductor wafer 1101 is not shown as having an underlying substrate layer similar to the substrate layer 1004 of the first semiconductor wafer 1001, since the illustrated embodiment assumes that such a substrate layer has been removed by back side etching (or other appropriate removal techniques) after bonding the inverted second semiconductor wafer 1101 to the IC chip 1000. Thus, a back side 1111 of the insulator layer 1103 is exposed. Once the underlying substrate is removed, the first semiconductor wafer 1001 provides the required stabilizing force necessary to protect and preserve the electrical characteristics of devices or structures in the active layer 1102. Additionally, further metallization or interconnect wiring (not shown) may extend through the insulator layer 1103 and be deposited on the back side 1111 of the insulator layer 1103 for back side electrical connections to the components in the active layer 1102.

Additionally, the inverted substrate 900 (including a portion of the TSVs 901) is shown as having been thinned by back side etching (or other appropriate removal techniques) prior to bonding the inverted second semiconductor wafer 1101 to the IC chip 1000. The thinning of the inverted substrate 900 is generally done to expose the TSVs 901 and make them of a desired length. Furthermore, the inverted substrate 900 is shown as having an additional trap rich layer 1112 formed after the thinning and prior to bonding the inverted second semiconductor wafer 1101 to the IC chip 1000.

Figure 12:
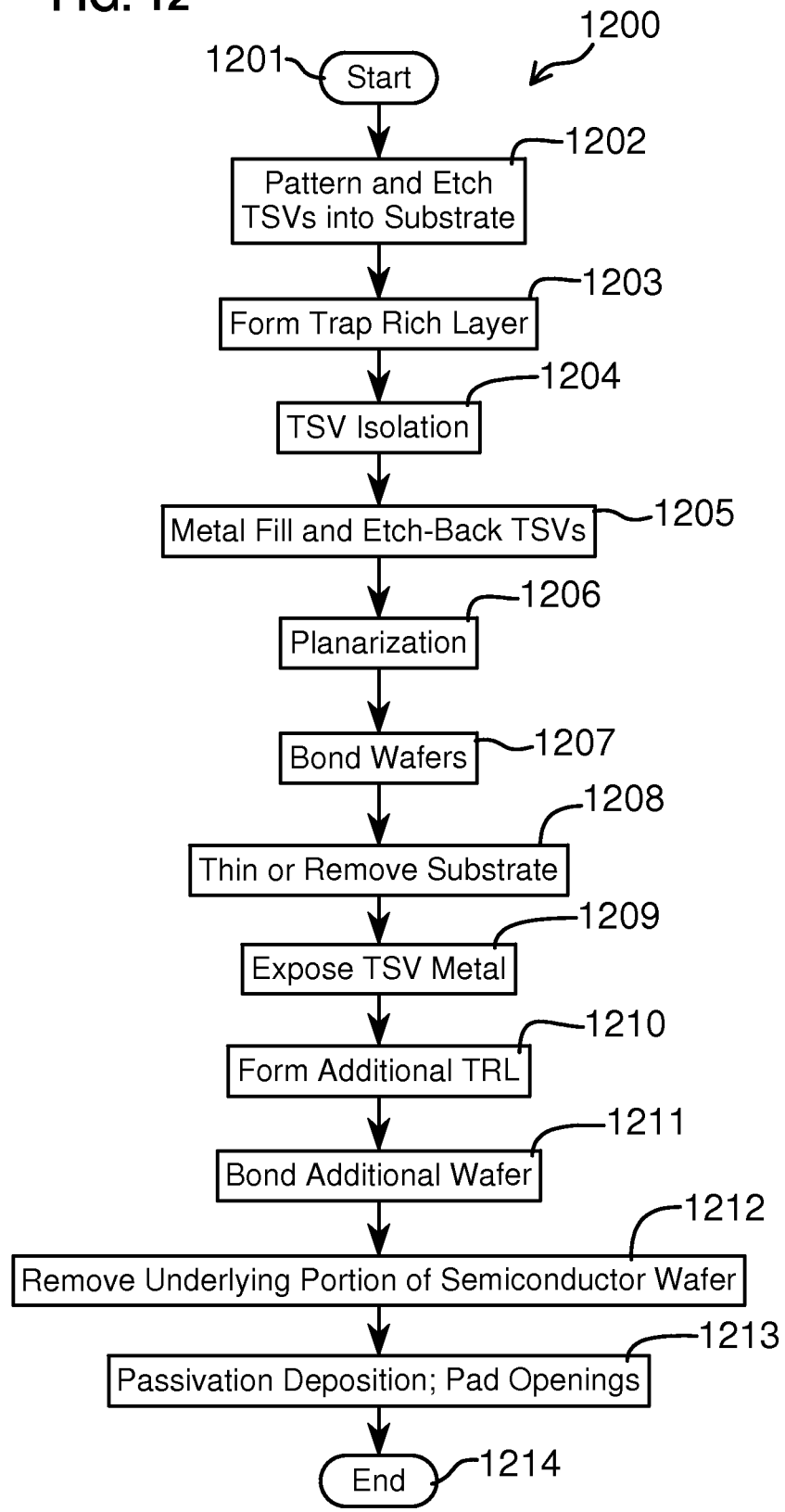
FIG. 12 is a simplified flow chart for an example process for fabricating one or more of the structures shown in FIGS. 9-11, according to embodiments of the present invention.

FIG. 12 shows a flowchart for a process 1200 for fabricating at least part of an integrated circuit chip (e.g. similar to structures 900, 1000 and/or 1100, FIGS. 9, 10 and/or 11), according to some embodiments of the present invention. It is understood, however, that the specific process 1200 is shown for illustrative purposes only and that other embodiments (in addition to specifically mentioned alternative embodiments) may involve other processes or multiple processes with other individual steps or a different order or combination of steps and still be within the scope of the present invention.

Upon starting (at 1201), preparation of the semiconductor substrate 900 (FIG. 9) begins. (For this embodiment, preparation of the semiconductor wafers 1001 and 1101 is assumed to occur separately and may be done in parallel with preparation of the semiconductor substrate 900.) At 1202, the holes for the TSVs 901 (including sufficient space for the TRL 903 and the isolation material 904) are patterned and etched into the semiconductor substrate 900.

At 1203, the TRL 903 is formed, e.g. by deposition of a conformal layer of TRL material onto the exposed surfaces of the semiconductor substrate 900, including on the walls and bottom of the TSV holes formed at 1202. In other embodiments, the TRL 903 includes the entire semiconductor material of the semiconductor substrate 900 and is formed by irradiating the semiconductor substrate 900 before or after the formation of the TSV holes at 1202. In still other embodiments, the TRL 903 is formed by ion implantation or by damaging the exposed surfaces of the semiconductor substrate 900. Alternatively, the TRL 903 may be formed by any other appropriate technique, including, but not limited to, those techniques described herein.

At 1204, the isolation material 904 is placed on the exposed surfaces of the TRL 903, e.g. by deposition of an appropriate material. At 1205, the metal material (or other conductive material) for the TSVs is 901 is filled into the remaining space of the TSV holes. Some of the metal material will accrue on areas outside the TSV holes, so the metal material is also etched back to remove this excess material and to make the metal material in the TSVs 901 generally coplanar with the rest of the top surface 902 of the substrate 900. Additionally, some or all of the isolation material 904 outside of the TSV holes may be etched back. The portions of the TRL 903 outside of the TSV holes, however, should not be significantly etched back.

An oxide or other suitable material may then be deposited on the top surface 902, if it is desired for the particular application. With or without the oxide, the top surface 902 is planarized (at 1206), e.g. by chemical-mechanical polishing (CMP) or other suitable technique.

At this point, the procedure 1200 has generally produced the semiconductor substrate 900 of FIG. 9. Additionally, preparation of the semiconductor wafer 1001 (FIG. 10) has occurred separately from that of the semiconductor substrate 900 to produce the semiconductor wafer 1001 with exposed conductors at the top surface 1010 thereof in a pattern that matches the pattern of the exposed TSVs 901 at the top surface 902 of the inverted semiconductor substrate 900. The top surface 902 of the semiconductor substrate 900 is then aligned with and bonded to (at 1207) the top surface 1010 of the semiconductor wafer 1001 to form the IC chip 1000.

At 1208, the back side of the inverted semiconductor substrate 900 is thinned or removed. Additionally, etching may be performed (at 1209) to expose the TSVs 901, e.g. down to the bottom surface 1109 of the inverted semiconductor substrate 900. (If the TRL 903 does not cover the entire sidewalls and/or bottom of the TSV holes 905, as mentioned above, then the etching at 1209 may generally be done at least down to a point at which the TRL 903 sufficiently surrounds the TSVs 901.) At 1210, the additional TRL 1112 is formed in or on the exposed portions of the semiconductor material at the bottom surface 1109 of the semiconductor substrate 900. The semiconductor material of the semiconductor substrate 900 is thereby generally surrounded by the TRLs 903 and 1112, and the TSVs 901 are surrounded by the trap rich layer 903, except at top and bottom ends thereof.

Alternatively, instead of bonding the semiconductor substrate 900 to an active wafer (e.g. the semiconductor wafer 1001 as shown in FIG. 10), in some embodiments, after the semiconductor substrate 900 has been formed at 1206, the top surface 902 of the semiconductor substrate 900 may be bonded to a temporary substrate (not shown). The back side of the semiconductor substrate 900 may then be thinned or removed (e.g. at 1208) and the TSVs 901 may be exposed (e.g. at 1209). The additional TRL 1112 may also be formed (e.g. at 1210). The resulting structure is generally a different TRL-enhanced TSV wafer that may then be layer transferred to another semiconductor wafer.

In other embodiments, the wafer to which the TSV-containing semiconductor substrate 900 is bonded may be composed of an insulating material. For example, the wafer may be an IPD (as mentioned above) on quartz or sapphire. Or the wafer may be a silicon on sapphire wafer. Or the wafer may be composed of high thermal conductivity material for thermal behavior improvement. Other options are also possible.

Preparation of the second semiconductor wafer 1101 (FIG. 11) has occurred separately from that of the semiconductor substrate 900 and the first semiconductor wafer 1001 to produce the second semiconductor wafer 1101 with exposed conductors at the top surface 1110 (inverted) thereof in a pattern that matches the pattern of the exposed TSVs 901 at the bottom surface 1109 of the inverted semiconductor substrate 900. The top surface 1110 of the inverted second semiconductor wafer 1101 is then aligned with and bonded to (at 1211) the bottom surface 1109 of the inverted semiconductor substrate 900. At 1212, the underlying portion of the second semiconductor wafer 1101 is thinned or removed down to the insulator layer 1103 to form the IC chip 1100 as shown in FIG. 11.

At 1213, various passivation deposition techniques are performed and pad openings are formed on the back side 1111, so the overall IC chip 1100 can be generally completed with bumps, pillars, or other post-processing metallization. The process 1200 then ends at 1214. As an alternative, however, various conductors may be exposed on the back side 1111, so that another a TRL-enhanced TSV wafer (e.g. similar to the semiconductor substrate 900, but likely with a different exposed conductor pattern) can be bonded to the back side 1111, followed by bonding another semiconductor wafer (e.g. similar to 1001 or 1101) thereto, as if repeating 1207 through 1212. Any appropriate number of semiconductor wafers (each separated by TRL-enhanced TSV wafers) may thus be stacked in this manner before proceeding to 1213.

In some alternative embodiments, the structure indicated by the reference number 1101 (FIG. 11) represents one or more layers of deposited materials of a circuit layer, instead of a second semiconductor wafer. In this case, after the additional TRL 1112 is formed at 1210, various layers of materials may be deposited and shaped to form an active device layer, an IPD layer, a circuit layer having mixed active and passive components, metal interconnect layers, etc. These embodiments thus provide a two-wafer (the first semiconductor wafer 1001 and the semiconductor substrate 900 with a deposited circuit layer) solution for forming an IC chip having two circuit layers, instead of a three-wafer (1001, 900 and 1101) solution. In some embodiments, the layers of materials may be similar to that described below with reference to FIG. 14.

Figure 13:
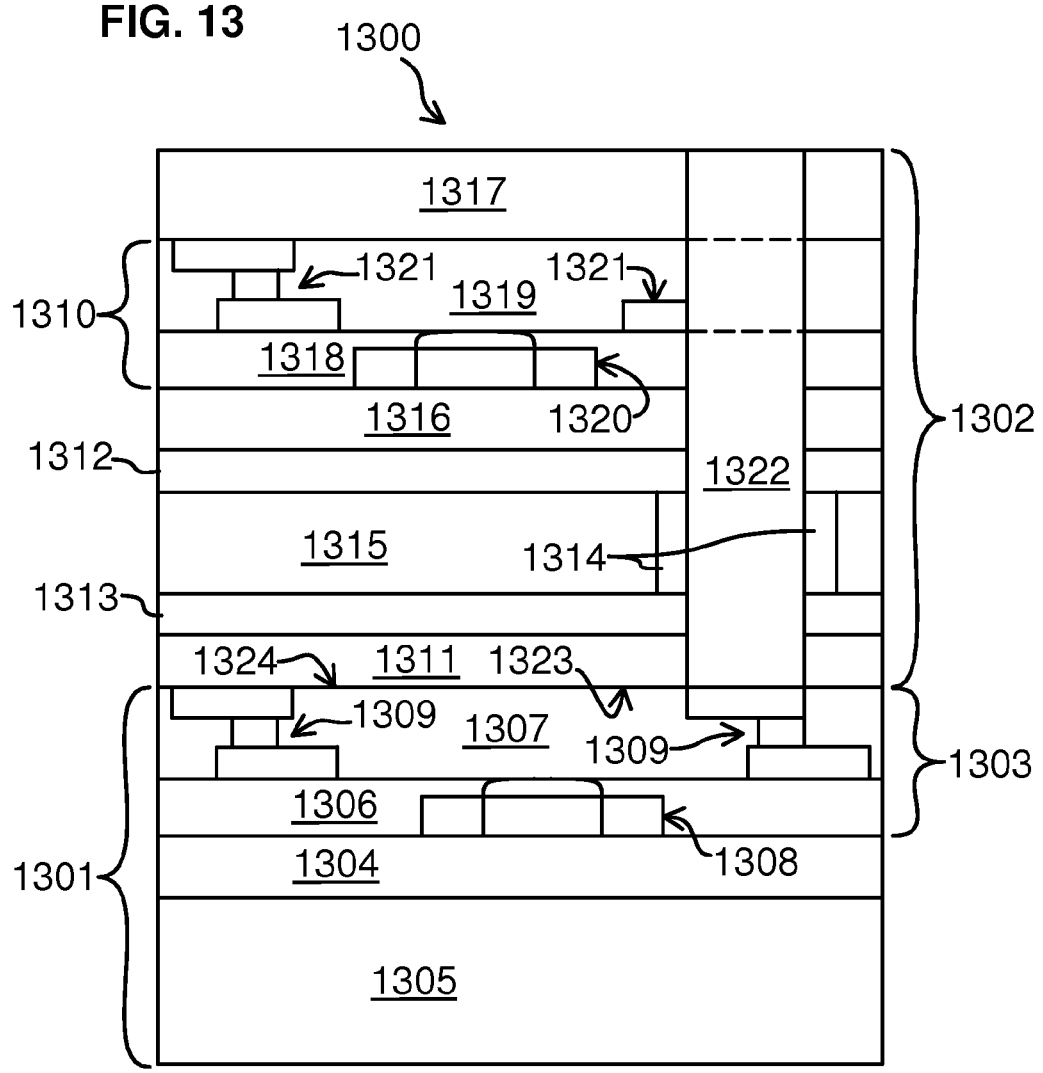
FIG. 13 is a simplified cross section diagram of a portion of an eighth IC chip including a variation on the semiconductor substrate shown in FIG. 9 bonded therein in accordance with another embodiment of the present invention.

Some embodiments of the present invention can be described with reference to FIG. 13. FIG. 13 illustrates a structure (e.g. part of an IC chip) 1300 having multiple layers of signal processing circuitry. The structure 1300 generally includes a first wafer 1301 and a second wafer 1302 bonded together by wafer bonding or layer transfer techniques. The second wafer 1302 may be non-inverted (as shown) or inverted.

The first wafer 1301 generally includes an active layer 1303, an insulator (e.g. an oxide or other dielectric) layer 1304 and a substrate layer 1305. The first wafer 1301 is optionally capped by another insulator layer (not shown). The active layer 1303 is a circuit layer that generally includes an active device layer 1306 and a metallization or metal interconnect layer 1307. The active layer 1303 thus also generally includes signal processing circuitry or circuit components, such as one or more active devices (e.g. a transistor 1308) in the active device layer 1306 and metal wiring 1309 in the metal interconnect layer 1307. In alternative embodiments, the active layer 1303 may be replaced with a circuit layer having IPDs or a mix of active and passive devices or circuit components, as described above.

The second wafer 1302 generally includes an active layer 1310, a bonding layer 1311, trap rich layers 1312, 1313 and 1314, a semiconductor substrate layer 1315 and underlying and overlying insulator (e.g. an oxide or other dielectric) layers 1316 and 1317. The active layer 1310 generally includes an active device layer 1318 and a metallization or metal interconnect layer 1319. The active layer 1310 thus also generally includes signal processing circuitry or circuit components, such as one or more active devices (e.g. a transistor 1320) in the active device layer 1318 and metal wiring 1321 in the metal interconnect layer 1319. Alternatively, the active layer 1310 may be replaced with a circuit layer having IPDs or a mix of active and passive devices or circuit components, as described above.

The trap rich layers 1312 and 1313 generally cover the top and bottom, respectively, of the semiconductor substrate layer 1315 to prevent or mitigate the parasitic surface conduction effects within the semiconductor substrate layer 1315 that may be caused by the active layers 1303 and 1310, as described herein. Additionally, the trap rich layers 1312 and 1313 may have any one or more of the characteristics and may be formed by any of the techniques described herein for other trap rich layers, depending on the requirements of a desired configuration or implementation.

The second wafer 1302 also generally includes at least one TSV 1322 that extends from a bottom surface 1323 of the second wafer 1302 through the intervening layers (1311, 1313, 1315, 1312 and 1316) and into the active device layer 1318. Optionally, the TSV 1322 may extend into the metal interconnect layer 1319 or even to the top surface of the overlying insulator layer 1317, as indicated by the dashed lines. The TSV 1322 may thus electrically connect the metal interconnect layer 1319 or active device layer 1318 in the second wafer 1302 to the metal interconnect layer 1307 in the first wafer 1301. Additionally, if a third wafer (not shown) is stacked onto the structure 1300 and the TSV 1322 is exposed at the top surface of the insulator layer 1317, then the TSV 1322 may further connect to exposed electrical conductors at the bonding surface of the third wafer.

Since the TSV 1322 extends through the semiconductor substrate layer 1315, the trap rich layer 1314 is provided around the TSV 1322, thereby separating or isolating the conductive material of the TSV 1322 from the semiconductor material of the semiconductor substrate layer 1315. The trap rich layer 1314, thus, prevents or mitigates the parasitic surface conduction effects within the semiconductor substrate layer 1315 that may be caused by the TSV 1322. Additionally, although the trap rich layer 1314 is shown extending only from the bottom of the upper trap rich layer 1312 to the top of the lower trap rich layer 1313, it is understood that the trap rich layer 1314 may extend beyond these boundaries, depending on the requirements of the design, the fabrication processes used and other factors. In some embodiments, for example, the trap rich layer 1314 may extend throughout the entire length of the TSV 1322 or stop at any appropriate intermediate point within that length.

Since the second wafer 1302 includes the TSV 1322 surrounded at least partially by the trap rich layer 1314, the second wafer 1302 may be considered a variation on the semiconductor substrate 900 of FIG. 9. In some embodiments, therefore, the formation of the TSV 1322 and trap rich layer 1314 may occur as described from 1202 to 1205 in the process 1200 (FIG. 12), and the active layer 1310 and the trap rich layers 1312 and 1313 may be formed before or after the formation of the TSV 1322 and trap rich layer 1314, as appropriate. In other embodiments, the TSV 1322 may be formed by bottom side processing after formation of the active layer 1310 (and optionally after bonding a handle wafer to the top of the second wafer 1302 and/or optionally after thinning of the semiconductor substrate layer 1315).

In some embodiments, formation of the lower trap rich layer 1313, since it is near the bottom side of the second wafer 1302, may preferably (but not necessarily) be done by bottom side processing (before or after forming the bonding layer 1311, as appropriate). Additionally, if the TSV 1322 is also formed by bottom side processing, then the trap rich layer 1313 may be formed before or after forming the TSV 1322, as appropriate. Furthermore, the semiconductor substrate layer 1315 may be thinned, if necessary or desirable, prior to formation of the trap rich layer 1313.

In some embodiments, the upper trap rich layer 1312 is formed within the semiconductor substrate layer 1315 of the second wafer 1302 prior to the formation of the active layer 1310. In this case, however, the subsequent formation of the structures in the active layer 1310 may degrade the trap rich layer 1312, as mentioned above. In other embodiments, the trap rich layer 1312 is formed after the formation of the active layer 1310. For example, the trap rich layer 1312 may be high resistivity material deposited onto a bottom surface of the insulator layer 1316, e.g. after a handle wafer (not shown) is bonded to the top of the second wafer 1302 and the underlying semiconductor substrate is removed or thinned to expose the insulator layer 1316. Alternatively, the underlying semiconductor substrate is not fully removed, and the trap rich layer 1312 is formed in at least part of the remaining portion of the underlying semiconductor substrate, e.g. by implantation of high energy particles to create a damaged area in the underlying semiconductor substrate, as mentioned above. Additionally, if the formation of the upper trap rich layer 1312 requires removal of all or a substantial portion of a preexisting substrate, then additional semiconductor material may be deposited onto the bottom of the second wafer 1302 if needed to form the semiconductor substrate layer 1315 prior to formation of the lower trap rich layer 1313.

If a handle wafer is used with the processing of the second wafer 1302, it may be removed either before or after the second wafer 1302 is bonded to the first wafer 1301. In variations of these embodiments, the handle wafer is optional and/or the overlying insulator layer 1317 originates as part of the bonding layer used to bond the handle wafer to the second wafer 1302. In other alternatives, the handle wafer remains attached to the second wafer 1302 immediately after bonding the first wafer 301 and the second wafer 1302, and then either the handle wafer or the substrate layer 1305 is removed or thinned.

In other alternative embodiments, the trap rich layers 1312 and/or 1313 are added to the second wafer 1302 by one or more layer transfer processes after the formation of the active layer 1310. (See the dual layer transfer technique described with reference to FIG. 5.) Thus, the trap rich layers 1312 and/or 1313 may be formed as a layer in (or as the entire extent of) one or more other handle wafers. The other handle wafer(s) is then bonded to the second wafer 1302, e.g. with the insulator layer 1316 (formed on either the other handle wafer or the second wafer 1302) serving as a bonding layer. Then any unnecessary thickness of the other handle wafer(s) is removed, leaving the trap rich layers 1312 and/or 1313 as part of the second wafer 1302.

In each case, the trap rich layers 1312 and 1313, as part of the second wafer 1302, are added to the first wafer 1301 after the formation of the active layer 1303 in the first wafer 1301. Therefore, the formation of the active layer 1303 generally does not affect the trap rich layers 1312 and 1313.

In other embodiments, the lower trap rich layer 1313 is added to the first wafer 1301, instead of to the second wafer 1302 (after the active layer 1303 is formed, but before the first wafer 1301 and the second wafer 1302 are bonded together). Additionally, the active layer 1310 may be formed before the bonding, so the formation of neither active layer 1303 nor 1310 affects the lower trap rich layer 1313. Alternatively, both trap rich layers 1312 and 1313 and the semiconductor substrate layer 1315 are added to the first wafer 1301, instead of to the second wafer 1302.

The bonding layer 1311 can generally be a combination of one or more insulator layers and passivation layers. The bonding layer 1311 may also be a material used to bond the bottom exposed surface 1323 of the second wafer 1302 to a top exposed surface 1324 of the first wafer 1301 during the wafer bonding or layer transfer procedure. In some embodiments, the bonding layer 1311 comprises an etch-stop layer used when removing material (e.g. part the semiconductor substrate layer 1315) from the second wafer 1302. In another alternative, the bonding layer 1311 is added to the first wafer 1301, instead of to the second wafer 1302, before wafer bonding or layer transfer.

Figure 14:
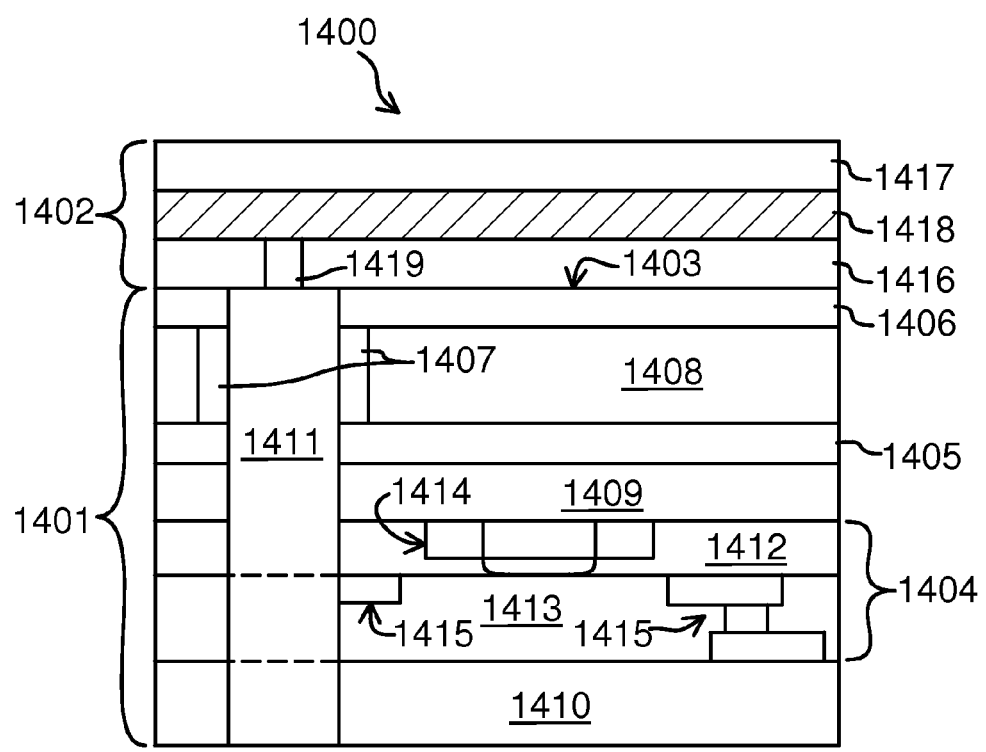
FIG. 14 is a simplified cross section diagram of a portion of a ninth IC chip including a variation on the semiconductor substrate shown in FIG. 9 in accordance with another embodiment of the present invention.

Some embodiments of the present invention can be described with reference to FIG. 14. FIG. 14 illustrates a structure (e.g. part of an IC chip) 1400 having multiple layers of signal processing circuitry. The structure 1400 generally includes an inverted wafer 1401 with layers of material 1402 deposited onto a bottom side (inverted) 1403 thereof. The inverted wafer 1401 is formed in some respects similarly to the second wafer 1302 (FIG. 13) and the semiconductor substrate 900 (FIG. 9) as discussed above.

The inverted wafer 1401 generally includes an active layer 1404, trap rich layers 1405, 1406 and 1407, a semiconductor substrate layer 1408, underlying and overlying insulator (e.g. an oxide or other dielectric) layers 1409 and 1410 and at least one TSV 1411. The active layer 1404 generally includes an active device layer 1412 and a metallization or metal interconnect layer 1413. The active layer 1404 thus also generally includes signal processing circuitry or circuit components, such as one or more active devices (e.g. a transistor 1414) in the active device layer 1412 and metal wiring 1415 in the metal interconnect layer 1413. Alternatively, the active layer 1404 may be replaced with a circuit layer having IPDs or a mix of active and passive devices or circuit components, as described above.

The deposited material layers 1402 generally include insulator layers 1416 and 1417 and a circuit layer 1418. An interconnect 1419 through an opening in the insulator layer 1416 electrically connects the circuit layer 1418 to the TSV 1411.

After formation of the inverted wafer 1401, the insulator layer 1416 is placed on the side 1403. The insulator layer 1416, for example, may be thick SiO2 to minimize capacitive parasitic coupling paths, AlN for surface acoustic wave (SAW) filter applications or other appropriate insulating materials.

The circuit layer 1418 is fabricated on top of the insulator layer 1416 after the interconnect 1419 is formed through the insulator layer 1416. The circuit layer 1418 is shown in a highly simplified manner because it may represent a wide variety of one or more layers of active devices, passive devices, metal interconnects and combinations thereof. For example, if the circuit layer 1418 is a passive device layer, it may be as simple as a single layer of thick metal for a high-Q inductor (e.g. a thick copper layer) or as complex as a full IPD layer (which may feature resistors, capacitors, inductors, filters, etc.).

After formation of the circuit layer 1418, the insulator layer 1417 may be formed thereon. Additionally, various passivation deposition techniques may be performed and pad openings formed, so the overall IC chip 1400 can be generally completed with bumps, pillars, or other post-processing metallization. These embodiments thus provide a single-wafer solution for forming an IC chip having two circuit layers, instead of a three-wafer (1001, 900 and 1101) solution.

The trap rich layers 1405 and 1406 generally cover the top and bottom, respectively, of the semiconductor substrate layer 1408 to prevent or mitigate the parasitic surface conduction effects within the semiconductor substrate layer 1408 that may be caused by the circuit layers 1404 and 1418, as described herein. Additionally, the trap rich layers 1405 and 1406 may have any one or more of the characteristics and may be formed by any of the techniques described herein for other trap rich layers, depending on the requirements of a desired configuration or implementation.

The TSV 1411 generally extends from the bottom side (inverted) 1403 of the inverted wafer 1401 through the intervening layers (1406, 1408, 1405 and 1409) and into the active device layer 1412. Optionally, the TSV 1411 may extend into the metal interconnect layer 1413 or even to the top surface of the overlying insulator layer 1410, as indicated by the dashed lines. The TSV 1411 may thus electrically connect the metal interconnect layer 1413 or active device layer 1412 in the inverted wafer 1401 to the interconnect 1419 in the deposited material layers 1402. Additionally, if a another wafer (not shown) is stacked onto the structure 1400 and the TSV 1411 is exposed at the top surface (inverted) of the insulator layer 1410, then the TSV 1411 may further connect to exposed electrical conductors at the bonding surface of the other wafer.

Since the TSV 1411 extends through the semiconductor substrate layer 1408, the trap rich layer 1407 is provided around the TSV 1411, thereby separating or isolating the conductive material of the TSV 1411 from the semiconductor material of the semiconductor substrate layer 1408. The trap rich layer 1407, thus, prevents or mitigates the parasitic surface conduction effects within the semiconductor substrate layer 1408 that may be caused by the TSV 1411. Additionally, although the trap rich layer 1407 is shown extending only from the bottom (inverted) of the trap rich layer 1405 to the top (inverted) of the trap rich layer 1406, it is understood that the trap rich layer 1407 may extend beyond these boundaries, depending on the requirements of the design, the fabrication processes used and other factors. In some embodiments, for example, the trap rich layer 1407 may extend throughout the entire length of the TSV 1411 or stop at any appropriate intermediate point within that length.

Since the inverted wafer 1401 includes the TSV 1411 surrounded at least partially by the trap rich layer 1407, the inverted wafer 1401 may be considered a variation on the semiconductor substrate 900 of FIG. 9. In some embodiments, therefore, the formation of the TSV 1411 and trap rich layer 1407 may occur as described from 1202 to 1205 in the process 1200 (FIG. 12) by bottom side processing after formation of the active layer 1404 (and optionally after bonding a handle wafer to the top of the inverted wafer 1401 and/or optionally after thinning of the semiconductor substrate layer 1408).

In some embodiments, formation of the trap rich layer 1406, since it is near the bottom side of the inverted wafer 1401, may preferably (but not necessarily) be done by bottom side processing (before or after forming the TSV 1411, as appropriate). Furthermore, the semiconductor substrate layer 1408 may be thinned, if necessary or desirable, prior to formation of the trap rich layer 1406.

In some embodiments, the trap rich layer 1405 is formed within the semiconductor substrate layer 1408 prior to the formation of the active layer 1404. In this case, however, the subsequent formation of the structures in the active layer 1404 may degrade the trap rich layer 1405, as mentioned above. In other embodiments, the trap rich layer 1405 is formed after the formation of the active layer 1404. For example, the trap rich layer 1405 may be high resistivity material deposited onto a bottom (inverted) surface of the insulator layer 1409, e.g. after a handle wafer (not shown) is bonded to the top of the inverted wafer 1401 and the underlying semiconductor substrate is removed or thinned to expose the insulator layer 1409. Alternatively, the underlying semiconductor substrate is not fully removed, and the trap rich layer 1405 is formed in at least part of the remaining portion of the underlying semiconductor substrate, e.g. by implantation of high energy particles to create a damaged area in the underlying semiconductor substrate, as mentioned above. Additionally, if the formation of the trap rich layer 1405 requires removal of all or a substantial portion of a preexisting substrate, then additional semiconductor material may be deposited onto the bottom of the inverted wafer 1401 if needed to form the semiconductor substrate layer 1408 prior to formation of the other trap rich layer 1406.

If a handle wafer is used with the processing of the inverted wafer 1401, it may be removed, if desired, e.g. after formation of the deposited material layers 1402. In variations of these embodiments, the handle wafer is optional and/or the overlying insulator layer 1417 originates as part of the bonding layer used to bond the handle wafer to the inverted wafer 1401.

In other alternative embodiments, the trap rich layers 1405 and/or 1406 are added to the inverted wafer 1401 by one or more layer transfer processes after the formation of the active layer 1404. (See the dual layer transfer technique described with reference to FIG. 5.) Thus, the trap rich layers 1405 and/or 1406 may be formed as a layer in (or as the entire extent of) one or more other handle wafers. The other handle wafer(s) is then bonded to the inverted wafer 1401, e.g. with the insulator layer 1409 (formed on either the other handle wafer or the inverted wafer 1401) serving as a bonding layer. Then any unnecessary thickness of the other handle wafer(s) is removed, leaving the trap rich layers 1405 and/or 1406 as part of the inverted wafer 1401.

Although embodiments of the present invention have been discussed primarily with respect to specific embodiments thereof, other variations are possible. Various configurations of the described system may be used in place of, or in addition to, the configurations presented herein. For example, additional layers of passivation and insulation could be disposed in-between described layers where appropriate. As another example, configurations were described with general reference to silicon substrates but any type of semiconductor material could be used in the place of silicon.

Those skilled in the art will appreciate that the foregoing description is by way of example only, and is not intended to limit the present invention. Nothing in the disclosure should indicate that the present invention is limited to systems that are implemented on a single wafer. Nothing in the disclosure should indicate that the present invention is limited to systems that require a particular form of semiconductor processing or to integrated circuits. In general, any diagrams presented are only intended to indicate one possible configuration, and many variations are possible. Those skilled in the art will also appreciate that methods and systems consistent with the present invention are suitable for use in a wide range of applications encompassing any related to improving the electrical performance of semiconductor structures.

While the specification has been described in detail with respect to specific embodiments of the present invention, it will be appreciated that those skilled in the art, upon attaining an understanding of the foregoing, may readily conceive of alterations to, variations of, and equivalents to these embodiments. These and other modifications and variations to the present invention may be practiced by those skilled in the art, without departing from the spirit and scope of the present invention, which is more particularly set forth in the appended claims.

What is claimed is:

1. An integrated circuit chip comprising:
a first circuit layer;
a trap-rich layer located above the first circuit layer;
a substrate having a first surface and a second surface, the substrate comprising:
   a via hole having an inside surface extending from the first surface of the substrate to its second surface; and
   a conductor disposed inside the via hole;
a second circuit layer located above the substrate;
wherein the substrate is located above the trap-rich layer; and
wherein the first circuit layer is electrically coupled with the conductor to the second circuit layer.

2. The integrated circuit chip of claim 1 further comprising:
a second trap-rich layer disposed between the substrate and the second circuit layer.

3. The integrated circuit chip of claim 1 further comprising:
a second trap-rich layer disposed between the inside surface of the via hole and the conductor.

4. The integrated circuit chip of claim 3 wherein the first and second trap-rich layers comprise polycrystalline semiconductor material or a layer of high-resistivity silicon.

5. The integrated circuit chip of claim 1 wherein the first circuit layer comprises:
an insulating layer having a first surface and a second surface; and
a first circuit-element layer contacting the first surface of the insulating layer.

6. The integrated circuit chip of claim 5 further comprising:
a metal bond pad formed on the second surface of the insulating layer, the metal bond pad being electrically connected to the first circuit layer.

7. The integrated circuit chip of claim 6 further comprising:
a passive layer coupled to the second surface of the insulating layer.

8. The integrated circuit chip of claim 1 wherein the second circuit layer comprises active and passive devices.

9. The integrated circuit chip of claim 1 wherein the second circuit layer comprises passive devices and does not comprise active devices.

10. The integrated circuit chip of claim 1 wherein the first circuit layer is directly electrically connected with the conductor to the second circuit layer.

11. The integrated circuit chip of claim 1, further comprising:
a second substrate comprising the first circuit layer; and
a metal pad located inside a second via hole, the metal pad being electrically connected to the first circuit layer;
wherein the second via hole extends through said second substrate.

12. The integrated circuit chip of claim 11, further comprising:
an insulating layer having a first surface and a second surface;
wherein the first circuit layer is in contact with the first surface of the insulating layer; and
wherein the first circuit layer and insulating layer are part of a layer transfer structure.

13. The integrated circuit chip of claim 11, further comprising: a passivation layer in contact with the second surface of the insulating layer.

14. The integrated circuit chip of claim 11, wherein the substrate comprises a polycrystalline semiconductor.

* * * * *